(12) United States Patent
Chen et al.

(10) Patent No.: US 11,631,746 B2
(45) Date of Patent: Apr. 18, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Yen-Ting Chen, Taichung (TW); Wei-Yang Lee, Taipei (TW); Feng-Cheng Yang, Zhudong Township (TW); Yen-Ming Chen, Chu-Pei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 102 days.

(21) Appl. No.: 17/121,385

(22) Filed: Dec. 14, 2020

(65) Prior Publication Data

US 2021/0126104 A1   Apr. 29, 2021

Related U.S. Application Data

(63) Continuation of application No. 16/371,498, filed on Apr. 1, 2019, now Pat. No. 10,868,130.

(Continued)

(51) Int. Cl.
| | |
|---|---|
| *H01L 29/49* | (2006.01) |
| *H01L 29/66* | (2006.01) |
| *H01L 29/78* | (2006.01) |
| *H01L 21/02* | (2006.01) |
| *H01L 21/311* | (2006.01) |

(Continued)

(52) U.S. Cl.
CPC ...... *H01L 29/4991* (2013.01); *H01L 21/0217* (2013.01); *H01L 21/02164* (2013.01); *H01L 21/02167* (2013.01); *H01L 21/31116* (2013.01); *H01L 21/764* (2013.01); *H01L 29/0847* (2013.01); *H01L 29/6653* (2013.01); *H01L 29/6656* (2013.01); *H01L 29/66545* (2013.01); *H01L 29/66636* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | |
|---|---|---|
| 9,070,624 B2 | 6/2015 | Chen et al. |
| 9,548,366 B1 | 1/2017 | Ho et al. |

(Continued)

FOREIGN PATENT DOCUMENTS

| | | |
|---|---|---|
| CN | 103165466 A | 6/2013 |
| CN | 107275281 A | 10/2017 |

(Continued)

*Primary Examiner* — J. E. Schoenholtz
(74) *Attorney, Agent, or Firm* — Slater Matsil, LLP

(57) ABSTRACT

A semiconductor device including a gaseous spacer and a method for forming the same are disclosed. In an embodiment, a method includes forming a gate stack over a substrate; forming a first gate spacer on sidewalls of the gate stack; forming a second gate spacer over the first gate spacer; removing a portion of the second gate spacer, at least a portion of the second gate spacer remaining; removing the first gate spacer to form a first opening; and after removing the first gate spacer, removing the remaining portion of the second gate spacer through the first opening.

20 Claims, 38 Drawing Sheets

Related U.S. Application Data

(60) Provisional application No. 62/753,348, filed on Oct. 31, 2018.

(51) Int. Cl.
  *H01L 21/764* (2006.01)
  *H01L 29/08* (2006.01)

(56) References Cited

U.S. PATENT DOCUMENTS

| | | |
|---|---|---|
| 9,716,096 B1 | 7/2017 | Ching et al. |
| 9,929,246 B1 | 3/2018 | Cheng et al. |
| 9,985,107 B2 | 5/2018 | Cheng et al. |
| 10,062,764 B1 * | 8/2018 | Wu .................. H01L 21/28247 |
| 10,395,988 B1 | 8/2019 | Cheng et al. |
| 10,510,861 B1 | 12/2019 | Yeh et al. |
| 10,559,671 B2 * | 2/2020 | Jagannathan ....... H01L 29/7827 |
| 10,868,130 B2 * | 12/2020 | Chen ............... H01L 21/823821 |
| 10,930,752 B2 | 2/2021 | Pan et al. |
| 2005/0048753 A1 | 3/2005 | Schwan |
| 2010/0025775 A1 | 2/2010 | Giles et al. |
| 2011/0147810 A1 | 6/2011 | Hsu et al. |
| 2016/0268434 A1 | 9/2016 | Ching et al. |
| 2017/0125586 A1 | 5/2017 | Lee et al. |
| 2017/0154991 A1 * | 6/2017 | Ko ..................... H01L 29/66545 |
| 2017/0207126 A1 * | 7/2017 | Ching ................. H01L 29/4991 |
| 2018/0006128 A1 | 1/2018 | Cheng et al. |
| 2019/0252239 A1 * | 8/2019 | Pal .................... H01L 29/66795 |
| 2019/0259854 A1 | 8/2019 | Jagannathan et al. |

FOREIGN PATENT DOCUMENTS

| | | |
|---|---|---|
| CN | 108288604 A | 7/2018 |
| KR | 20070053462 A | 5/2007 |
| KR | 20160132011 A | 11/2016 |
| WO | 2015138202 A1 | 9/2015 |
| WO | 2017105384 A1 | 6/2017 |

* cited by examiner

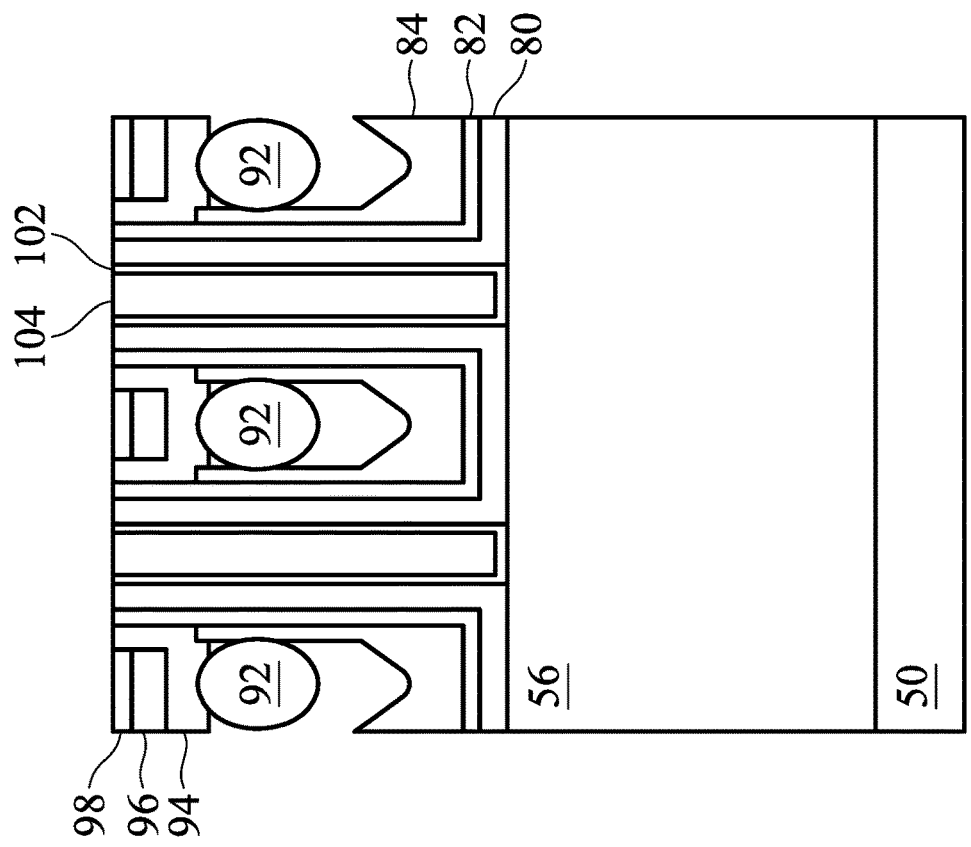
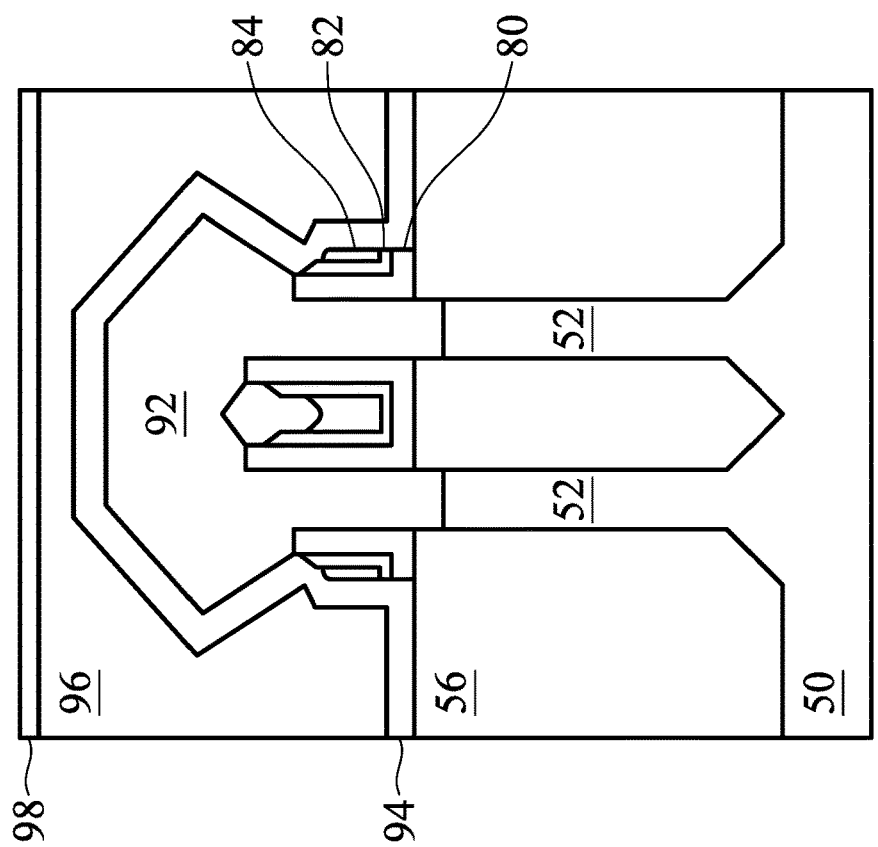
FIG. 16C
FIG. 16D

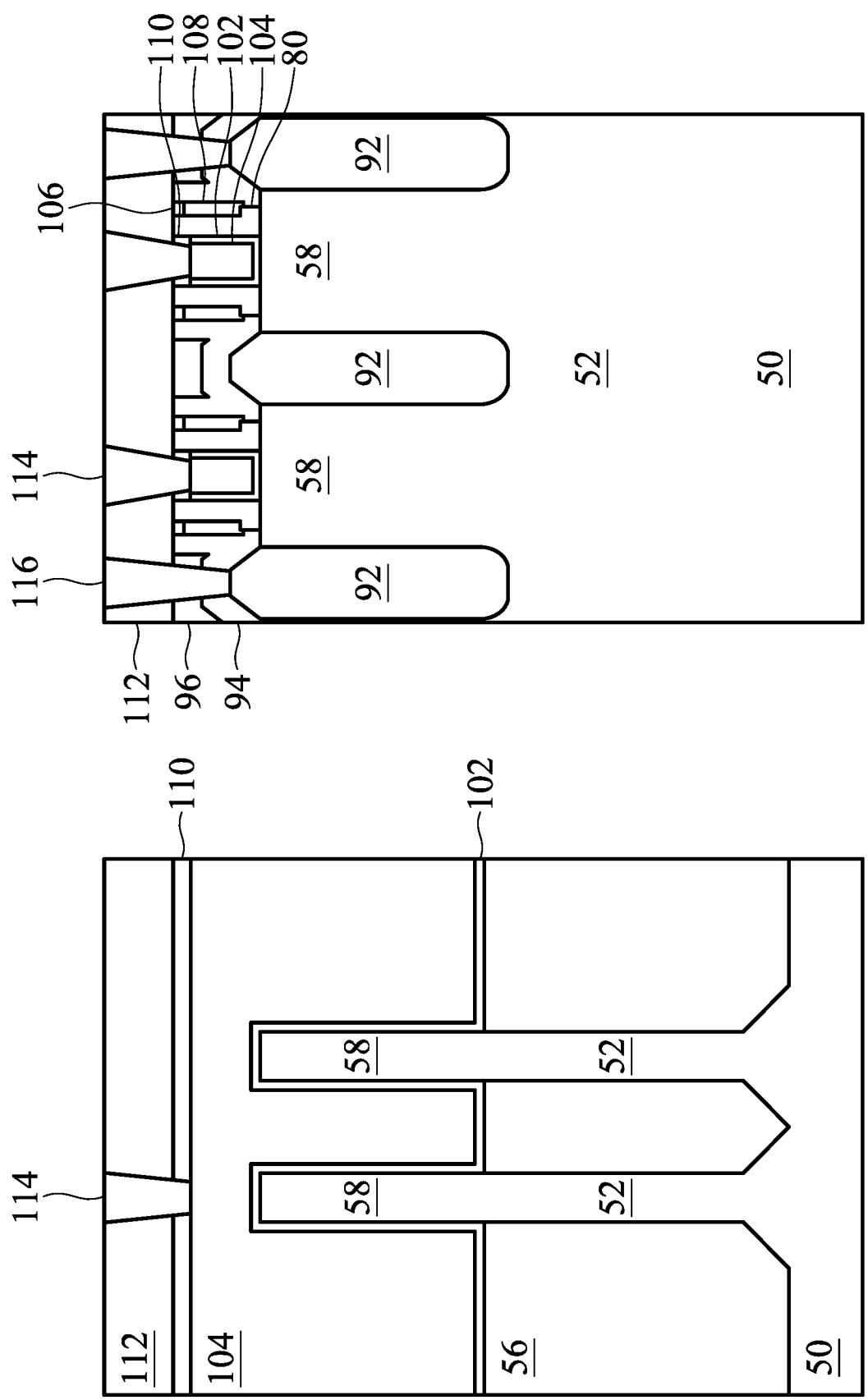

SEMICONDUCTOR DEVICE AND METHOD OF MANUFACTURE

PRIORITY CLAIM AND CROSS-REFERENCE

This application is a continuation application of U.S. patent application Ser. No. 16/371,498, filed on Apr. 1, 2019 (now U.S. Pat. No. 10,868,130, issuing Dec. 15, 2020), and entitled "Semiconductor Device and Method of Manufacture," which application claims the benefit of U.S. Application No. 62/753,348, filed on Oct. 31, 2018, and entitled "Semiconductor Device and Method of Manufacture," which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A-8D, 9A-9D, 10A-10D, 11A-11E, 12A-12D, 13A-13D, 14A-14D, 15A-15D, 16A-16E, 17A-17D, 18A-18E, 19A-19D, 20A-20D, and 21A-21D are cross-sectional views of intermediate stages in the manufacturing of FinFETs, in accordance with some embodiments.

DETAILED DESCRIPTION

Figure 1:
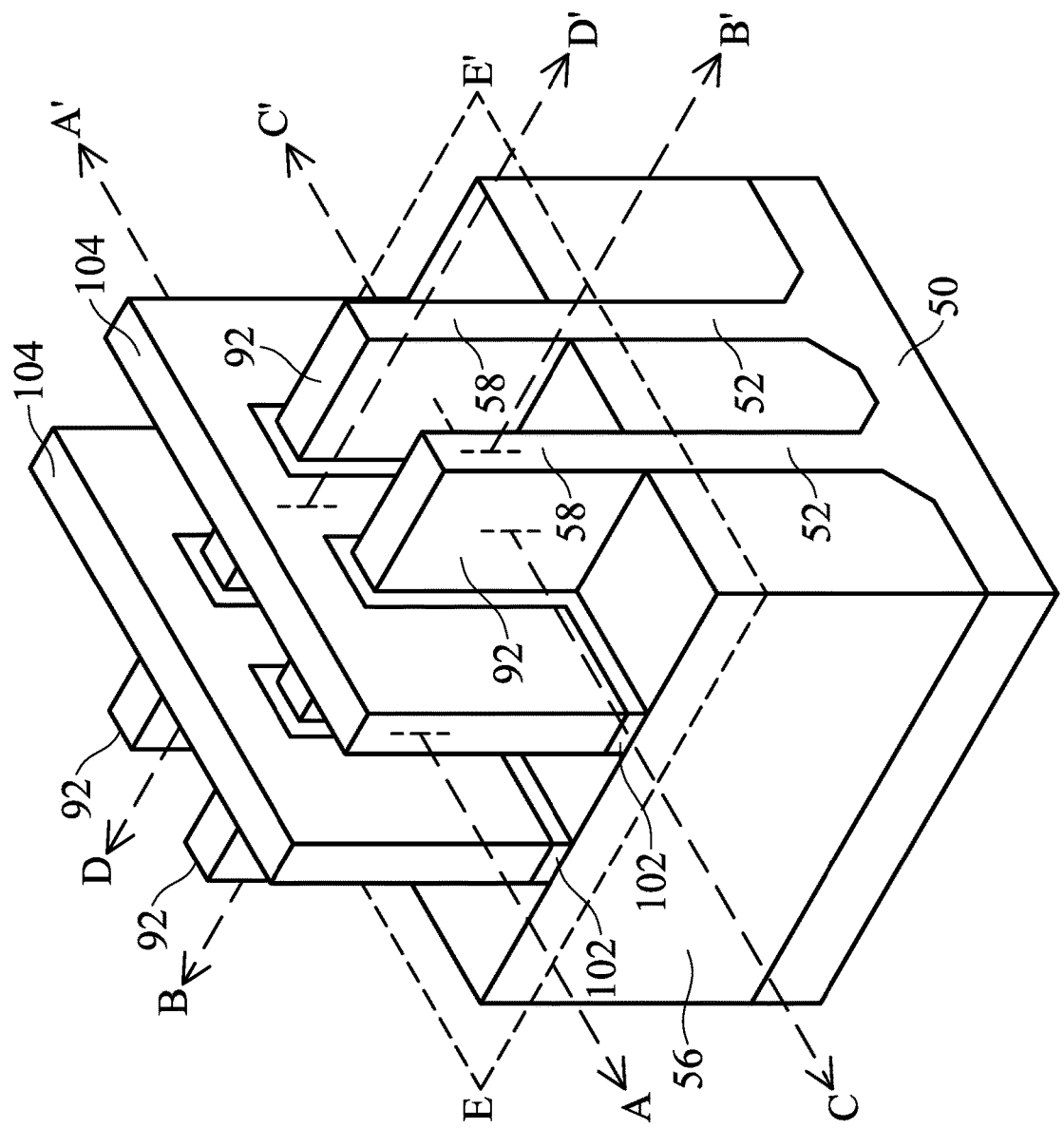
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming improved gate spacer layers. For example, a first gate spacer, a second gate spacer, and a third gate spacer may be formed adjacent a dummy gate stack. Portions of the third gate spacer may be removed. Epitaxial source/drain regions, an interlayer dielectric layer may be formed, and the dummy gate stack may be replaced by a metal gate stack. The second gate spacer may be removed to form an opening exposing the remaining portions of the third gate spacer. The remaining portions of the third gate spacer may be removed by etching through the opening. A contact etch stop layer may be formed over the opening formed by removing the second gate spacer and the remaining portions of the third gate spacer, forming gaseous spacers between the first gate spacer and the inter-layer dielectric layer.

The gaseous spacers may have a dielectric constant of 1 or close to 1, which may be less than the dielectric constant of the remaining portions of the third gate spacer and the second gate spacer. Replacing the remaining portions of the third gate spacer and the second gate spacer with the gaseous spacers may reduce the parasitic capacitance of a resulting device and improve circuit speed in the resulting device. As such, semiconductor devices including gaseous spacers formed by these processes may have improved device performance.

FIG. 1 illustrates an example of a FinFET in a three-dimensional view, in accordance with some embodiments. The FinFET comprises fins 52 on a substrate 50 (e.g., a semiconductor substrate). Shallow trench isolation (STI) regions 56 are disposed in the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as a single, continuous material as the substrate 50, the fins 52 and/or the substrate 50 may comprise a single material or a plurality of materials. In this context, the fins 52 refer to the portion extending between the neighboring STI regions 56.

Gate dielectric layers 102 are along sidewalls and over a top surface of the fins 52, and gate electrodes 104 are over the gate dielectric layers 102. Epitaxial source/drain regions 92 are disposed in opposite sides of the fin 52 with respect to the gate dielectric layers 102 and gate electrodes 104. FIG. 1 further illustrates reference cross-sections that are used in later figures. Cross-section A-A' is along a longitudinal axis of one of the gate electrodes 104 and in a direction, for example, perpendicular to the direction of current flow between the epitaxial source/drain regions 92 of the FinFET. Cross-section B-B' is perpendicular to cross-section A-A' and is along a longitudinal axis of one of the fins 52 and in a direction of, for example, a current flow between the epitaxial source/drain regions 92 of the FinFET. Cross-section C-C' is parallel to cross-section A-A' and extends through the epitaxial source/drain regions 92 of the FinFET. Cross-section D-D' is parallel to cross-section B-B' and extends through the gate electrodes 104 of the FinFET. Cross-section E-E' is perpendicular to cross-sections A-A', B-B', C-C', and D-D', parallel to a major surface of the substrate 50, and extends through the fins 52 and the gate electrodes 104. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 18B:
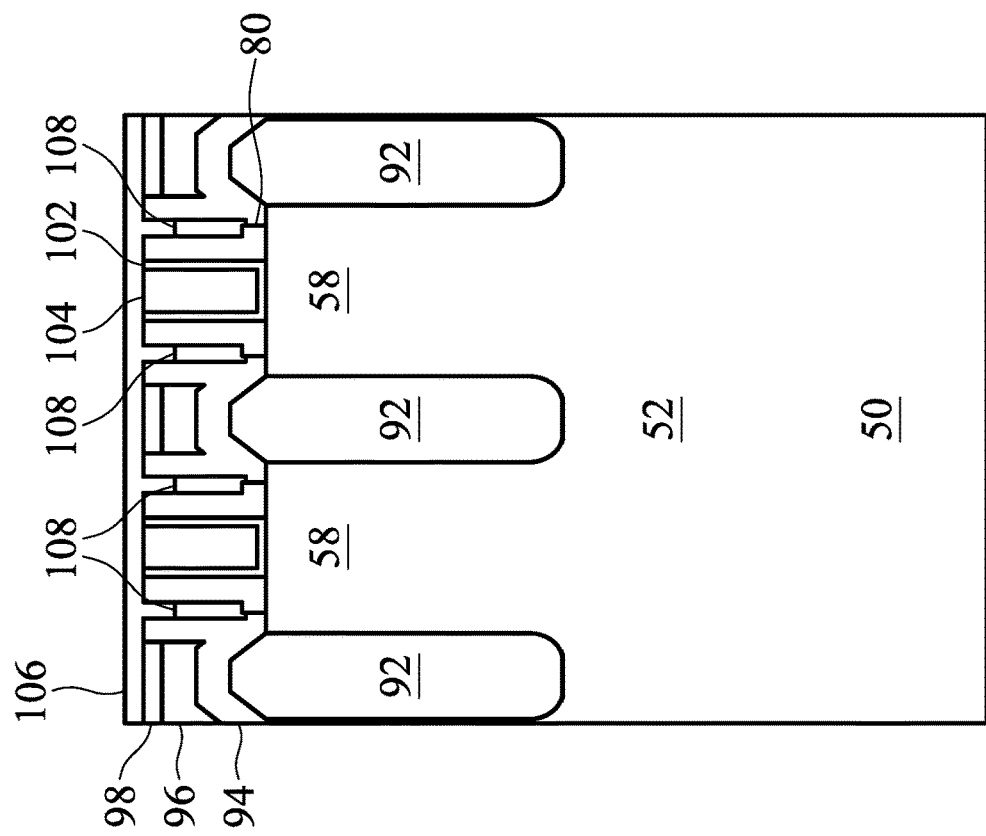
Figure 18A:
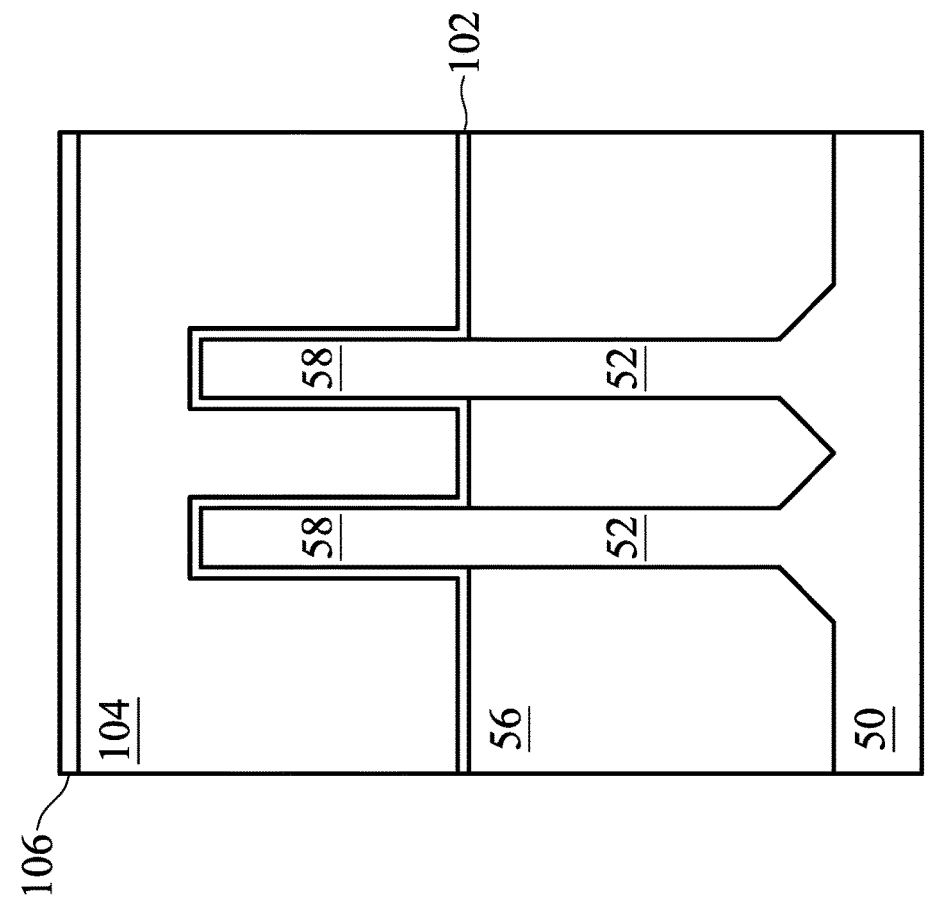
Figure 18D:
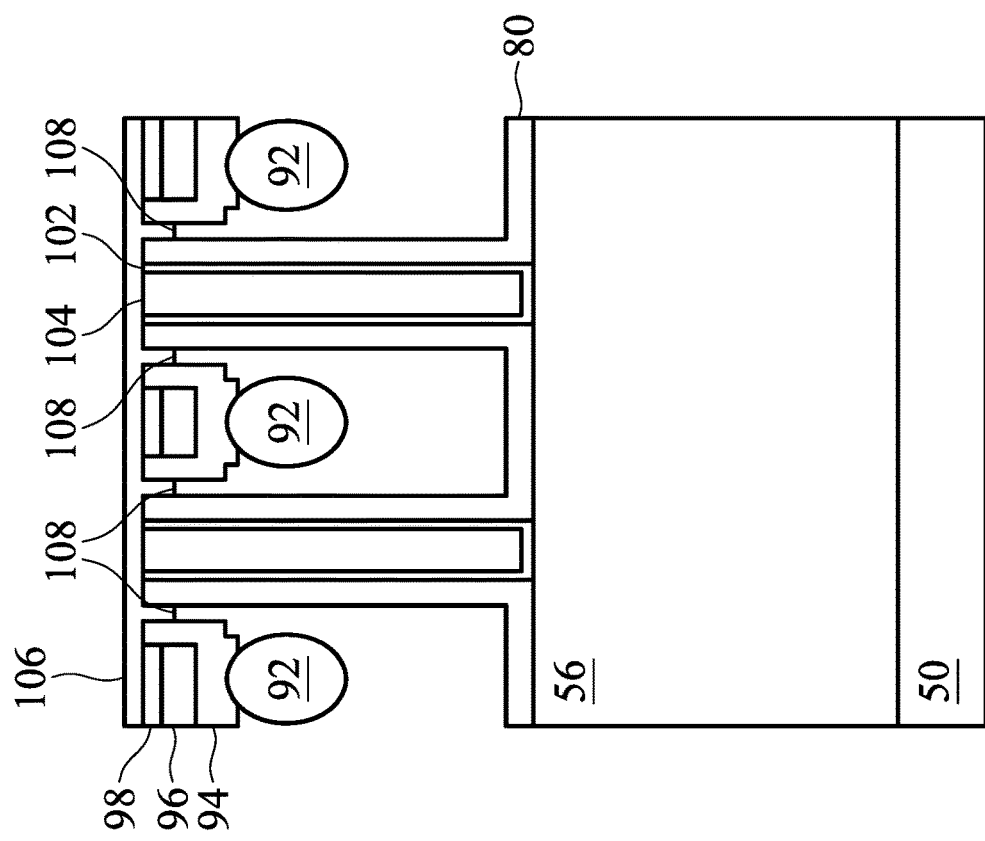
Figure 18C:
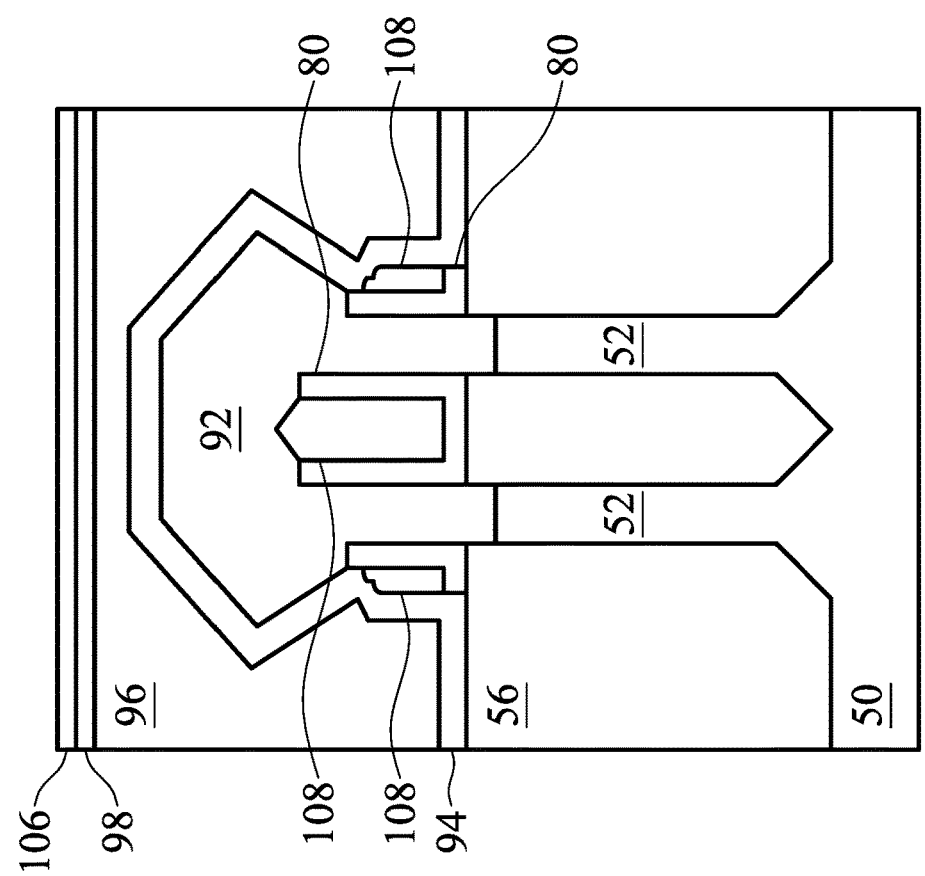
Figure 18E:
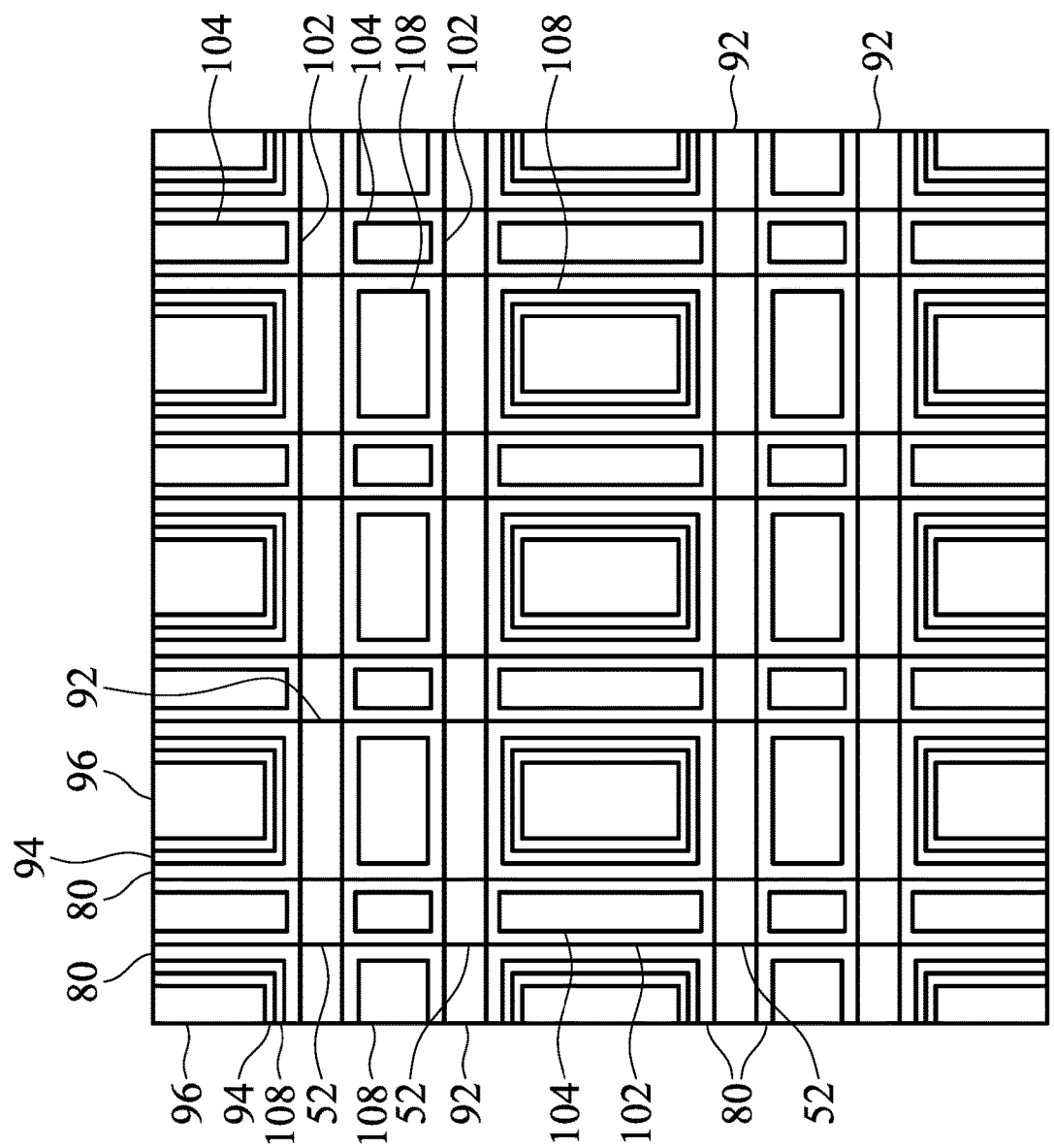

FIGS. 2 through 20B are cross-sectional views of intermediate stages in the manufacturing of FinFETs, in accordance with some embodiments. FIGS. 2 through 7 illustrate reference cross-section A-A' illustrated in FIG. 1, except for multiple fins/FinFETs. FIGS. 8A, 9A, 10A, 11A, 12A, 13A, 14A, 15A, 16A, 17A, 18A, 19A, 20A, and 21A are illustrated along reference cross-section A-A' illustrated in FIG. 1. FIGS. 8B, 9B, 10B, 11B, 12B, 13B, 14B, 15B, 16B, 16E, 17B, 18B, 19B, 20B, and 21B are illustrated along reference cross-section B-B' illustrated in FIG. 1. FIGS. 8C, 9C, 10C, 11C, 11E, 12C, 13C, 14C, 15C, 16C, 17C, 18C, and 19C are illustrated along reference cross-section C-C' illustrated in FIG. 1. FIGS. 8D, 9D, 10D, 11D, 12D, 13D, 14D, 15D, 16D, 17D, 18D, and 19D are illustrated along reference cross-section D-D' illustrated in FIG. 1. FIG. 18E is illustrated along reference cross-section E-E' illustrated in FIG. 1.

Figure 2:
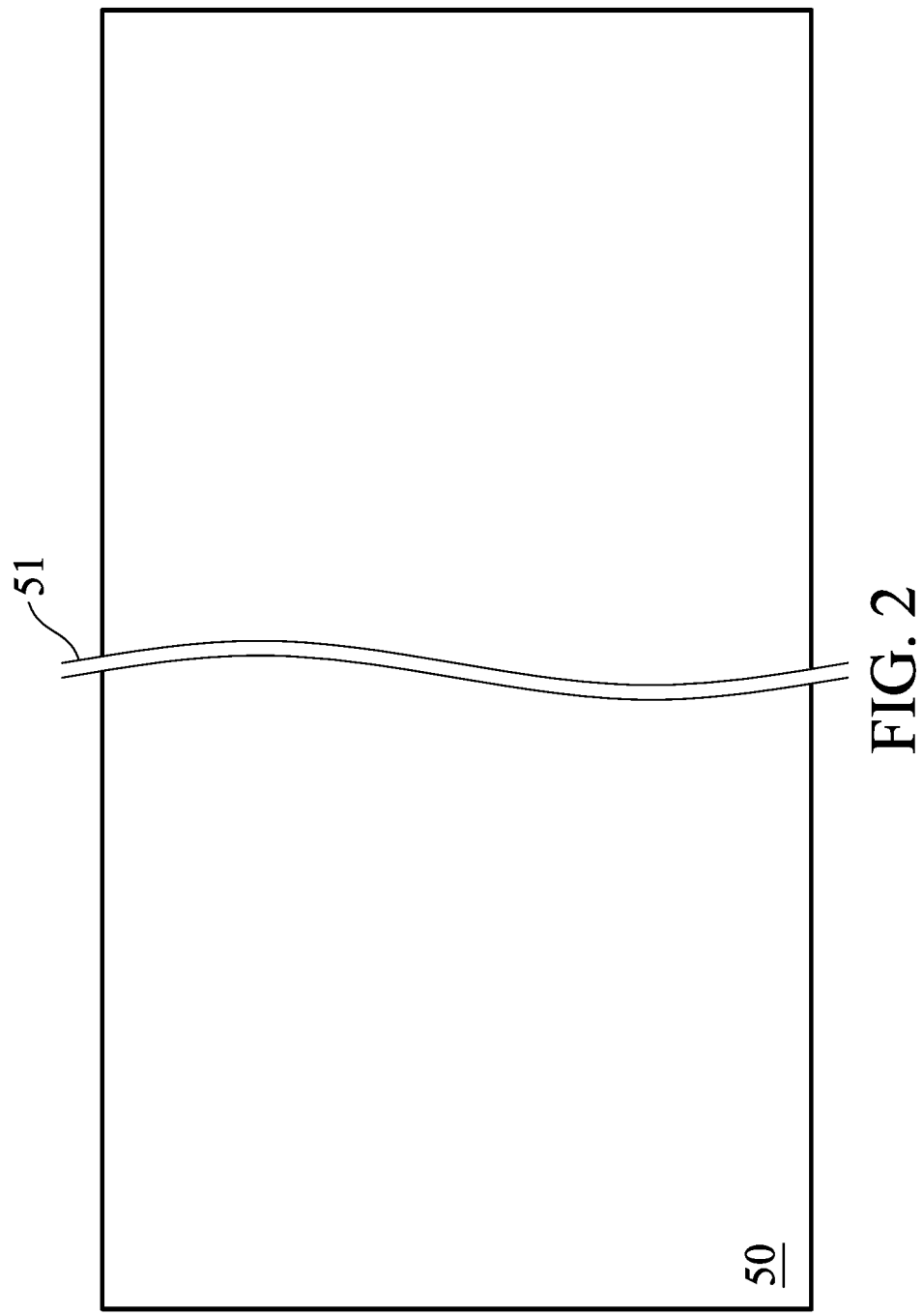

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
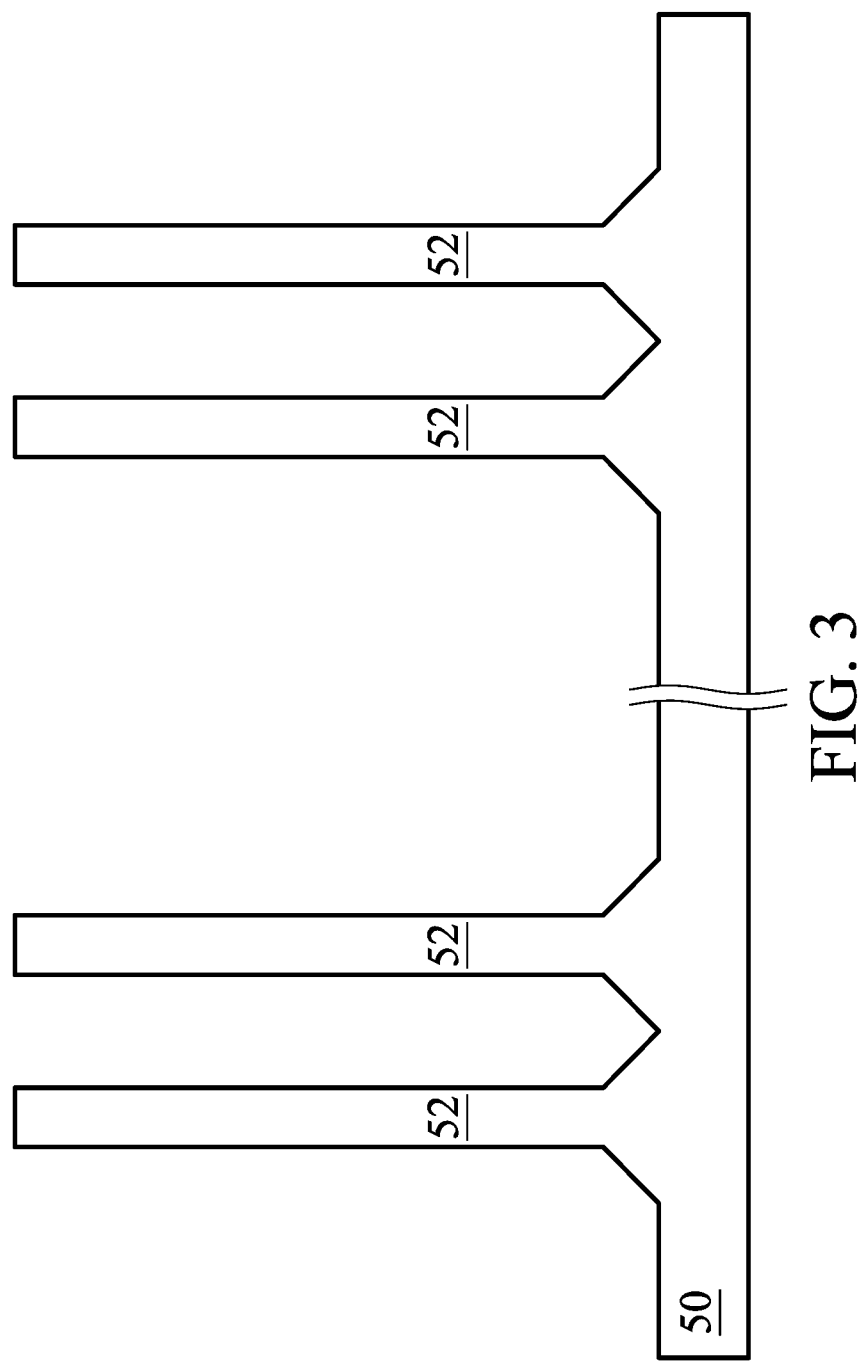

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52.

Figure 4:
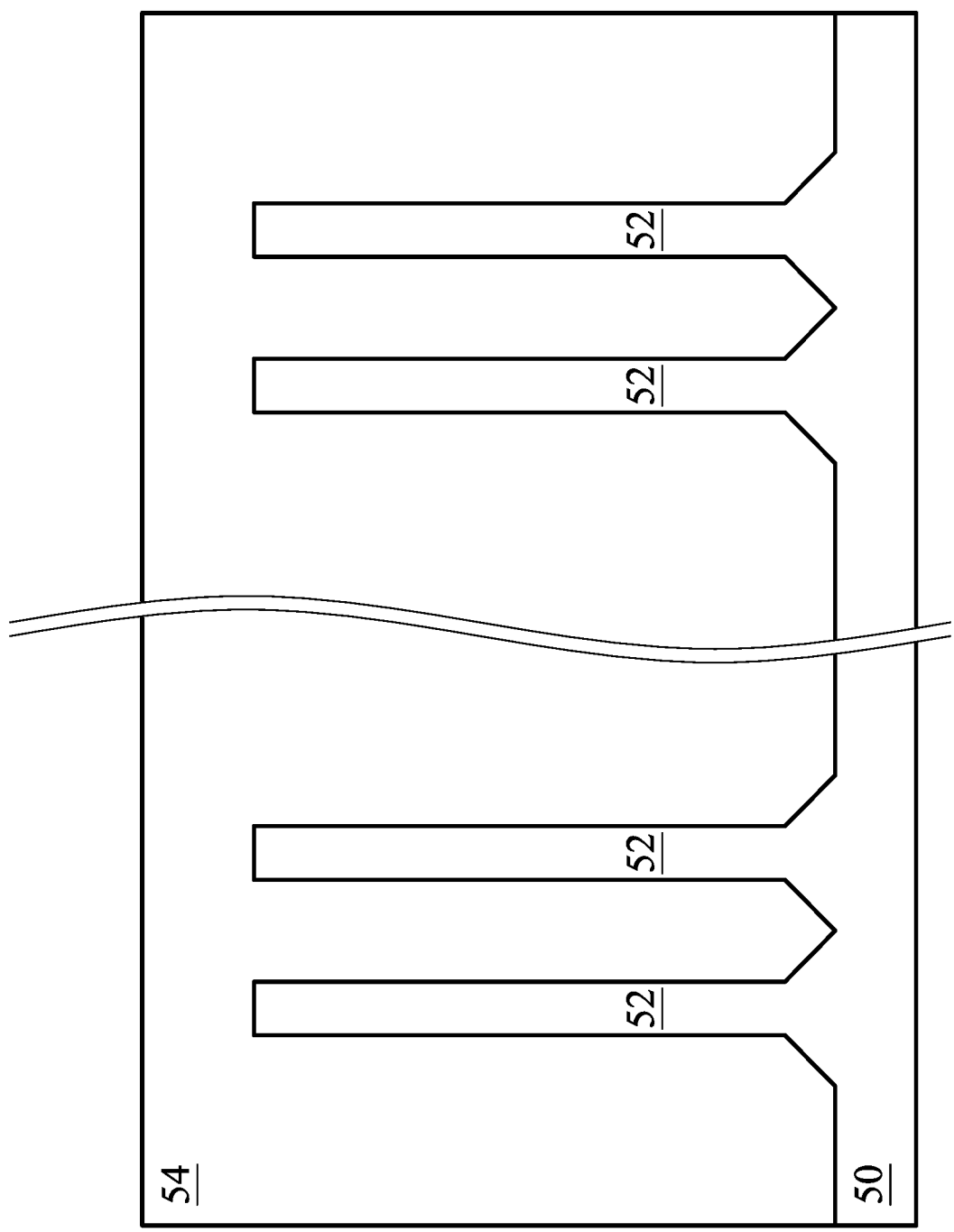

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material 54 is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
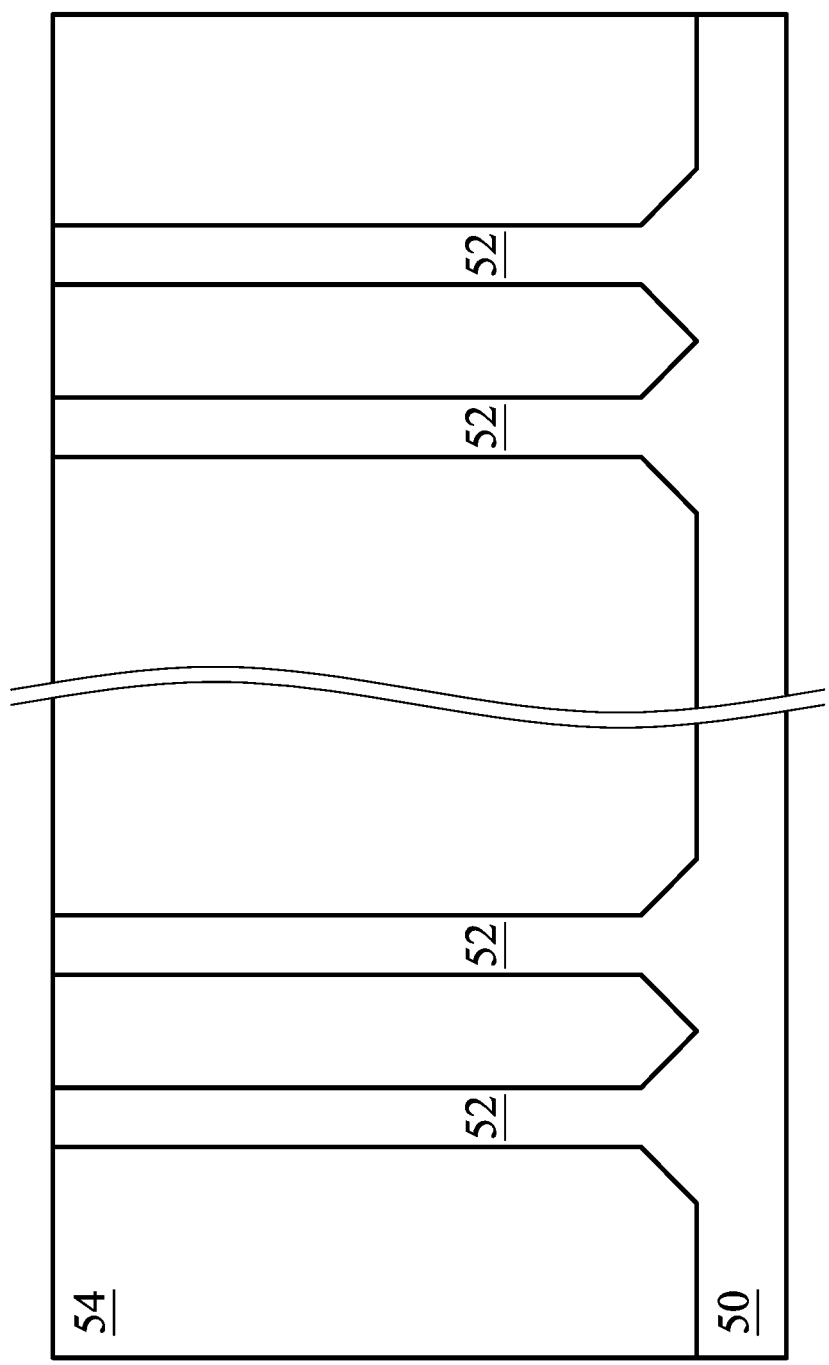

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
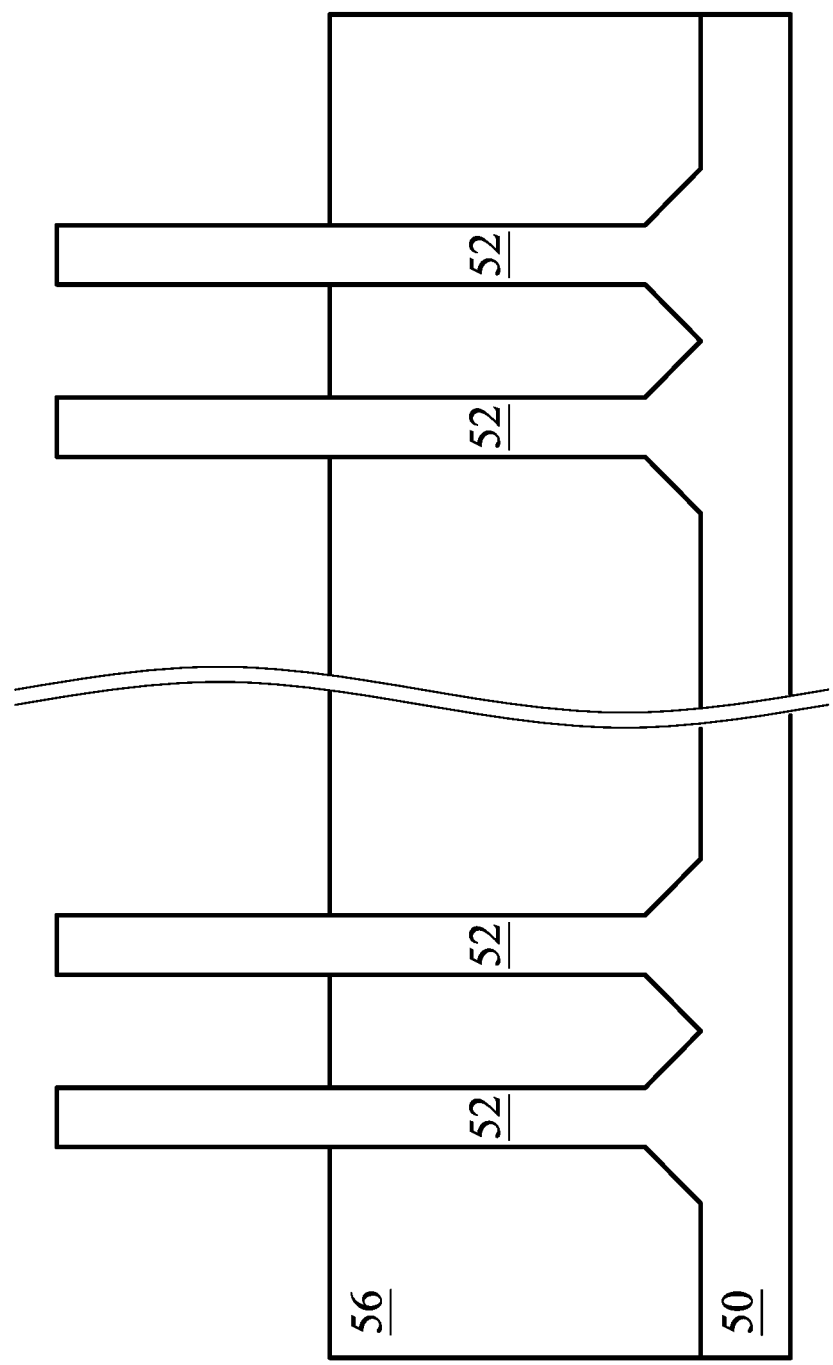

In FIG. 6, the insulation material 54 is recessed to form shallow trench isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form the fins 52. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not separately illustrated) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
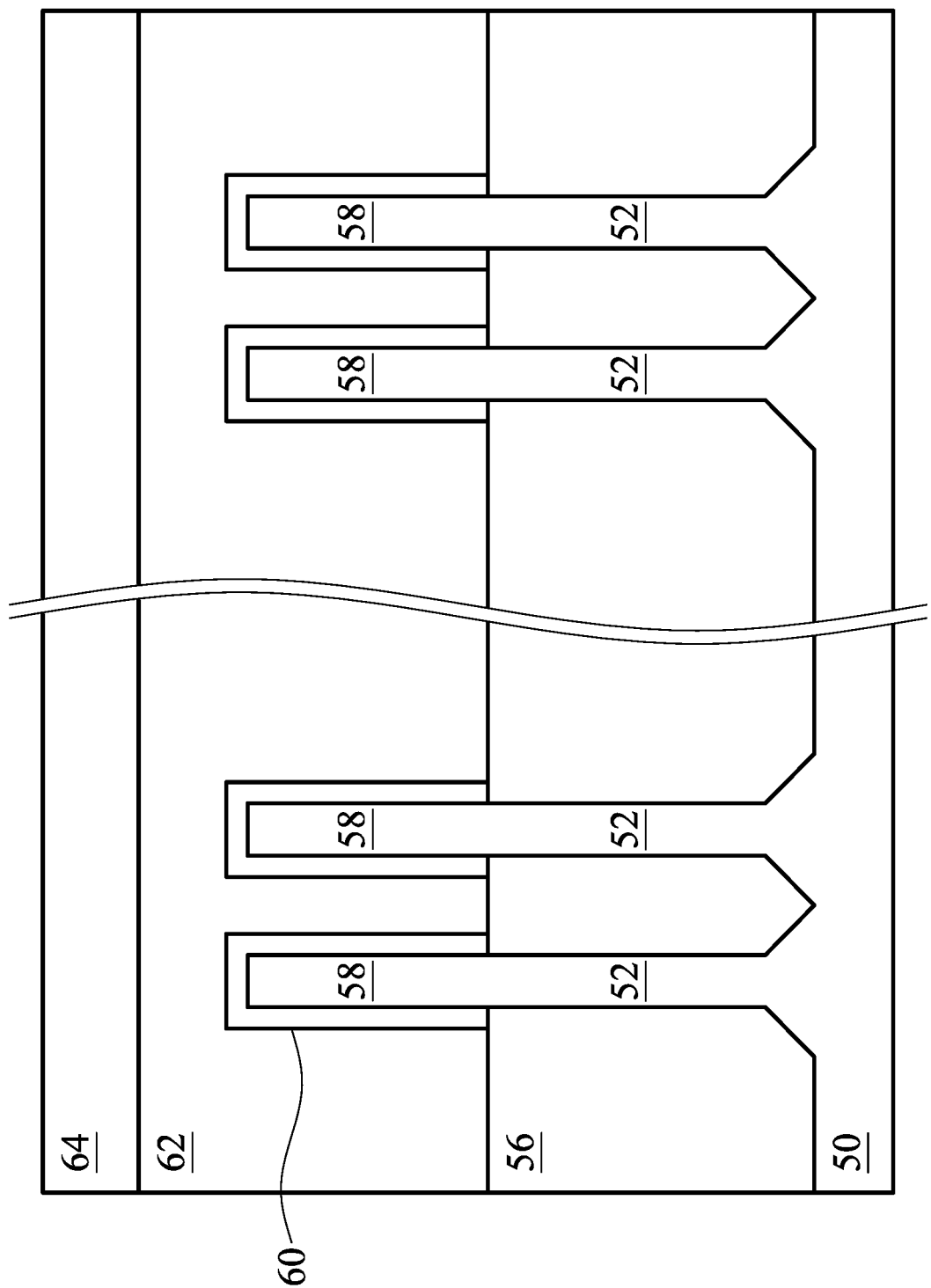
Figure 8B:
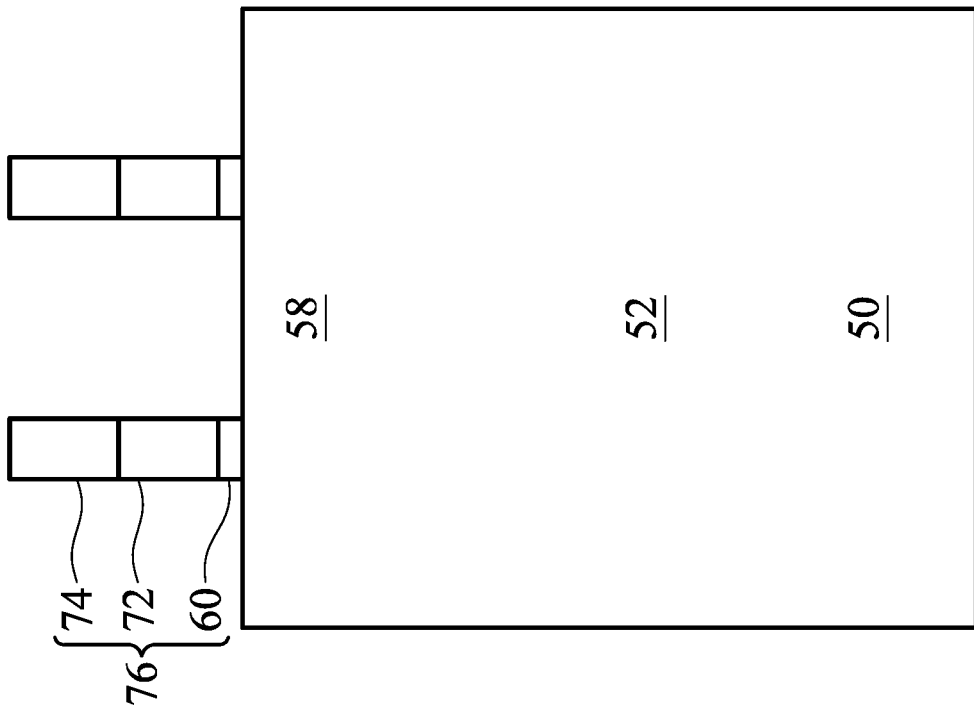
Figure 8A:
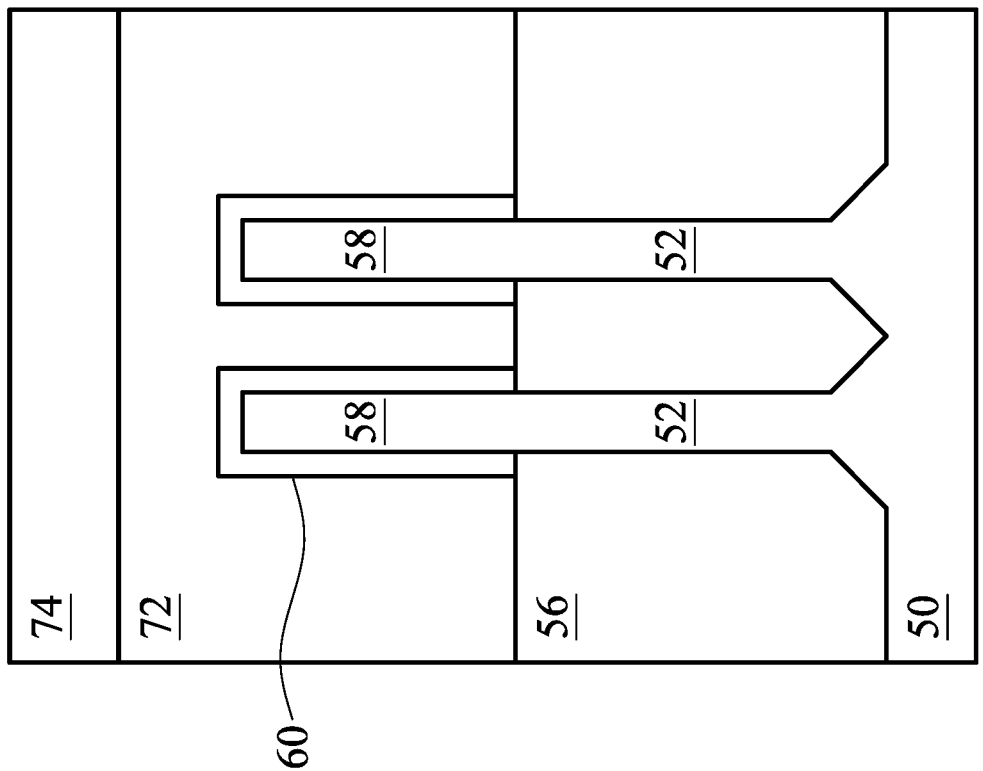
Figure 8D:
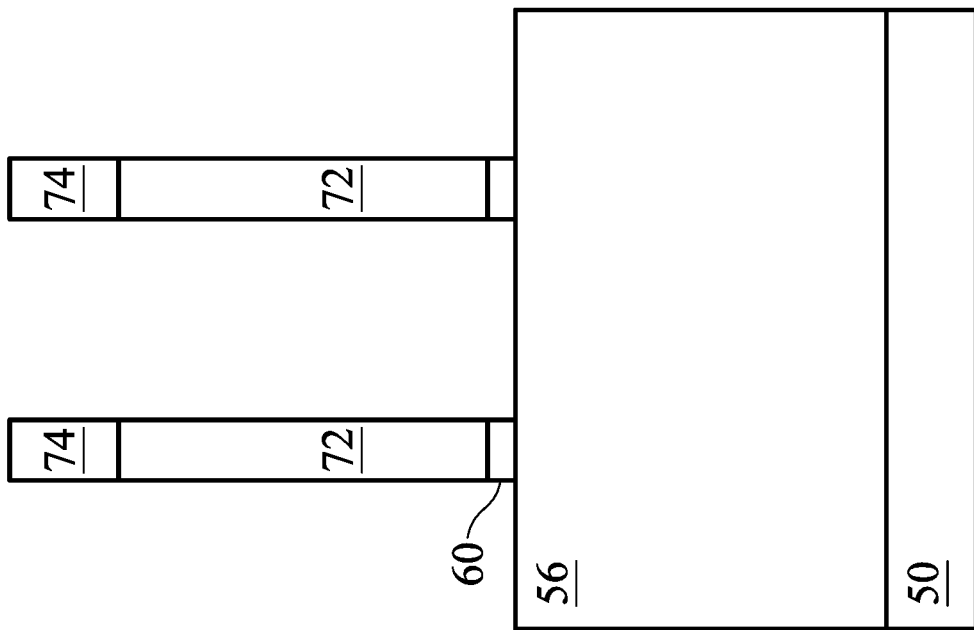
Figure 8C:
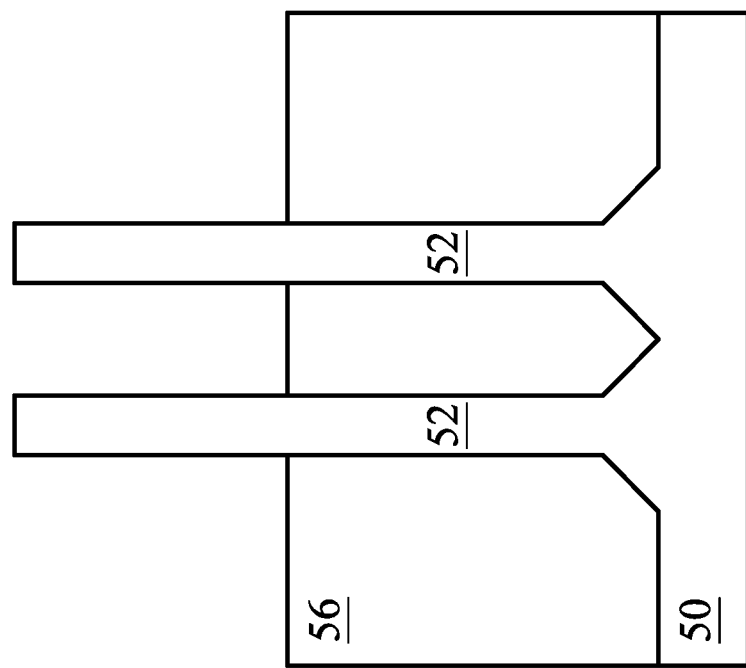

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 21D illustrate various additional steps in the manufacturing of embodiment devices. FIGS. 8A through 21D illustrate features in either of the region 50N and the region 50P. For example, the structures illustrated in FIGS. 8A through 21D may be applicable to both the region 50N and the region 50P. Differences (if any) in the structures of the region 50N and the region 50P are described in the text accompanying each figure.

In FIGS. 8A-8D, the mask layer 64 (see FIG. 7) may be patterned using acceptable photolithography and etching techniques to form masks 74. The pattern of the masks 74 then may be transferred to the dummy gate layer 62 to form dummy gates 72. The pattern of the masks 74 may also be transferred to the dummy dielectric layer 60 by an acceptable etching technique. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52. The combination of the dummy gates 72, the masks 74, and the dummy dielectric layer 60 may be referred to as dummy gate stacks 76.

In FIGS. 9A-9D, first gate spacers 80, second gate spacers 82, and third gate spacers 84 are formed on exposed surfaces of the dummy gate stacks 76 and/or the fins 52. The first gate spacers 80 may be formed by a conformal deposition process, such as atomic layer deposition (ALD), CVD, or the like. The first gate spacers 80 may comprise an insulating material, such as silicon nitride, silicon oxide, SiCN, a combination thereof, or the like. In a particular embodiment, the first gate spacers 80 comprise SiCN. The first gate spacers 80 may have a thickness of from about 0.5 nm to about 5 nm, such as about 5 nm. The second gate spacers 82 may be formed over the first gate spacers 80 by a conformal deposition process, such as ALD, CVD, or the like. The second gate spacers 82 may comprise an insulating material, such as silicon nitride, silicon oxide, SiCN, a combination thereof, or the like. In a particular embodiment, the second gate spacers 82 comprise silicon oxide. The second gate spacers 82 may have a thickness of from about 0.5 nm to about 5 nm, such as about 5 nm.

Figure 9B:
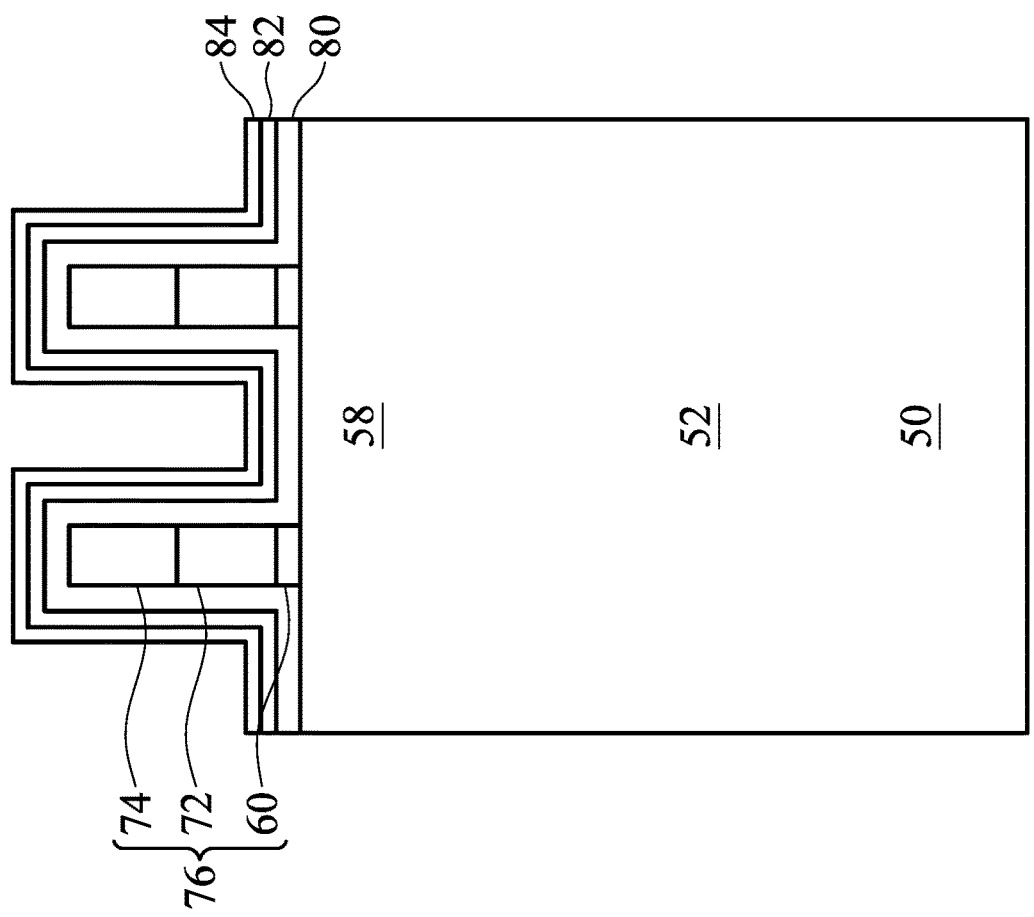
Figure 9A:
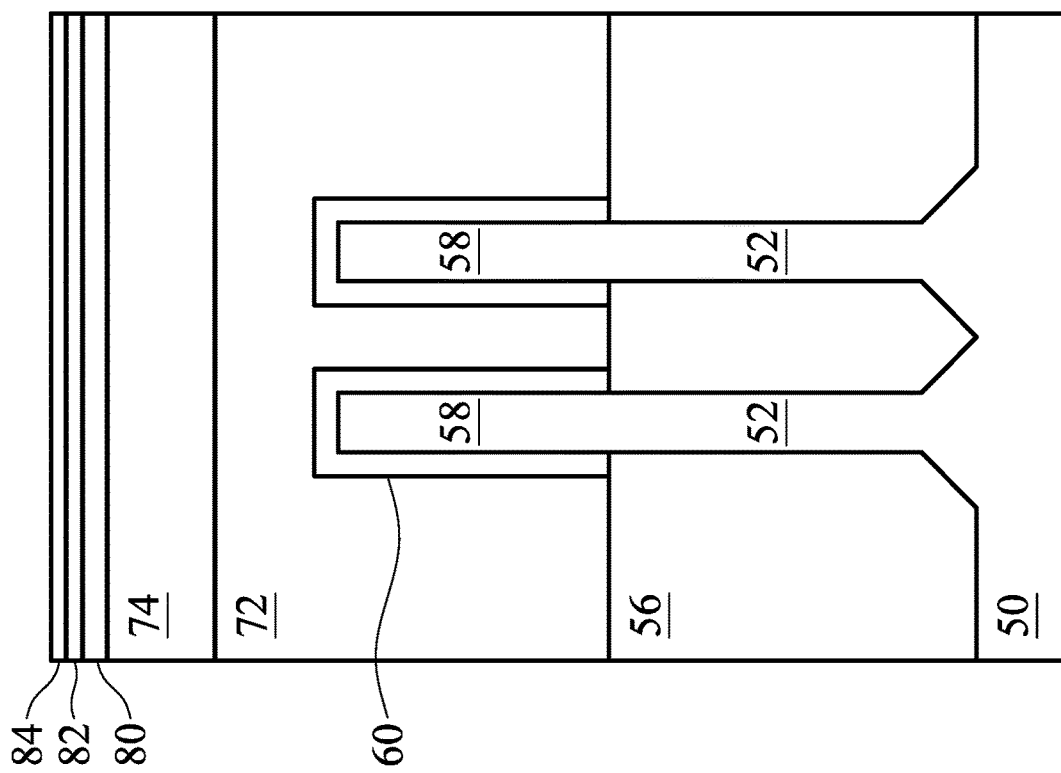
Figure 9D:
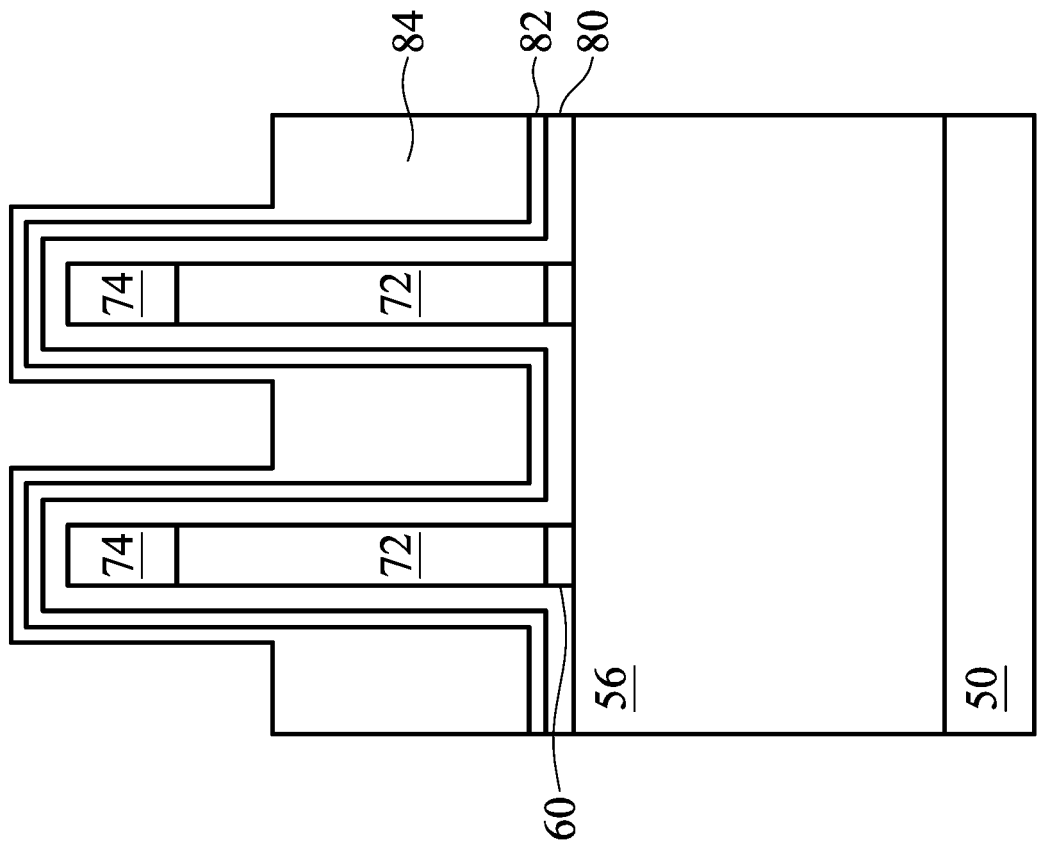
Figure 9C:
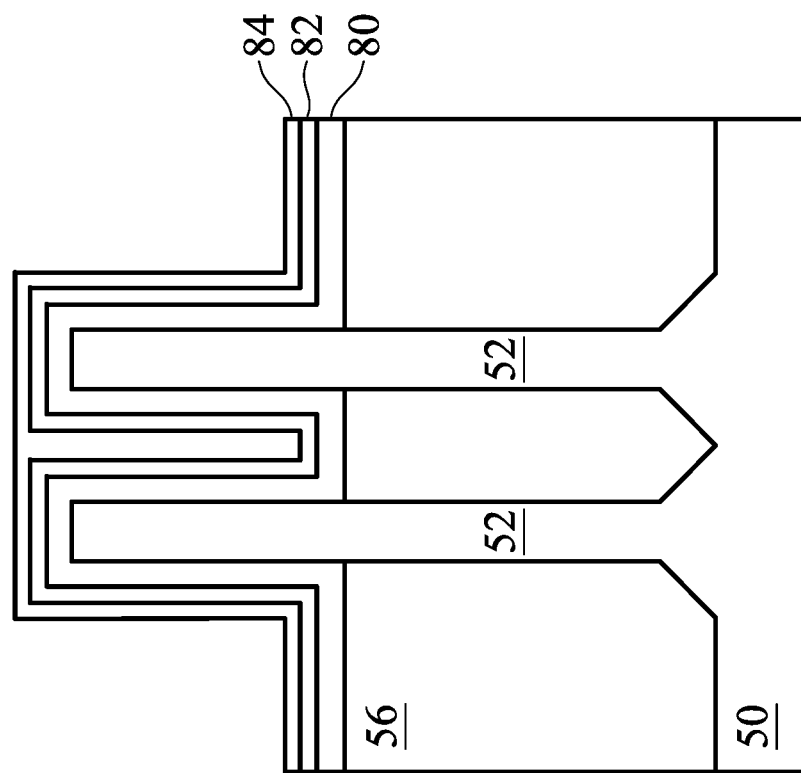

The third gate spacers 84 may be formed over the second gate spacers 82 by a conformal deposition process, such as ALD, CVD, or the like. The third gate spacers 84 may comprise an insulating material, such as silicon nitride, silicon oxide, SiCN, a combination thereof, or the like. In a particular embodiment, the third gate spacers 84 comprise silicon nitride. The third gate spacers 84 may have a thickness of from about 0.5 nm to about 5 nm, such as about 5 nm. As illustrated in FIGS. 9C and 9D, portions of the third gate spacers 84 disposed on adjacent fins 52 or adjacent dummy gate stacks 76 may merge.

The first gate spacers 80 may be formed of a material having a different etch selectivity from the material of the second gate spacers 82 and the third gate spacers 84. As such, the second gate spacers 82 and the third gate spacers 84 may be removed without removing the first gate spacers 80. The second gate spacers 82 and the third gate spacers 84 may be formed of the same or different materials and may have the same or different etch selectivity from one another.

Figure 10B:
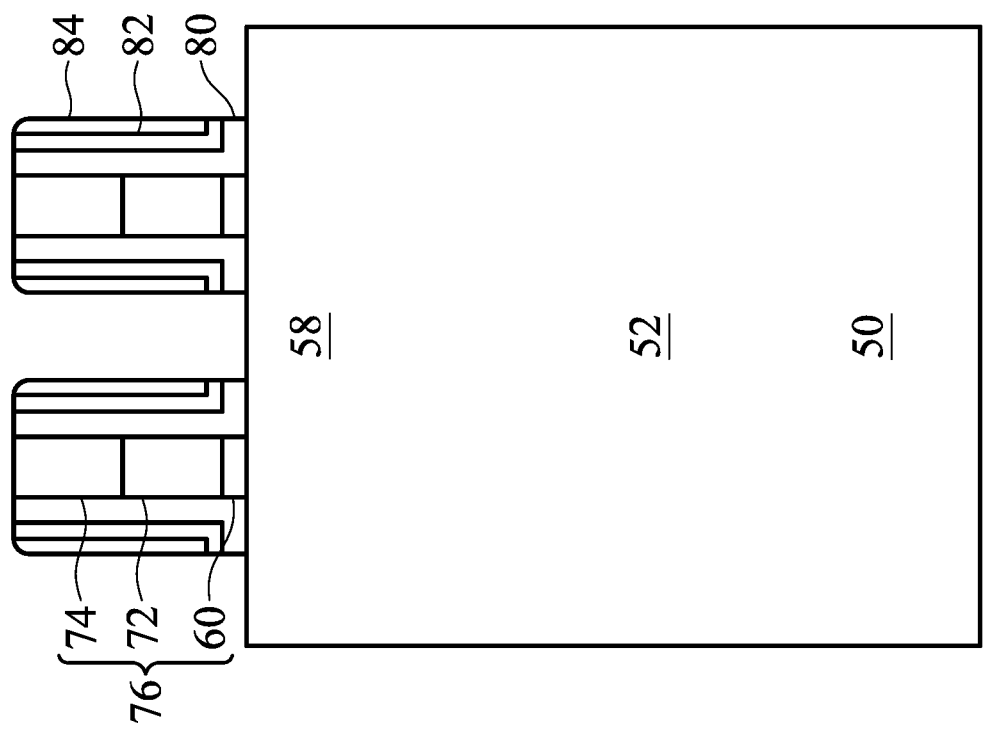
Figure 10A:
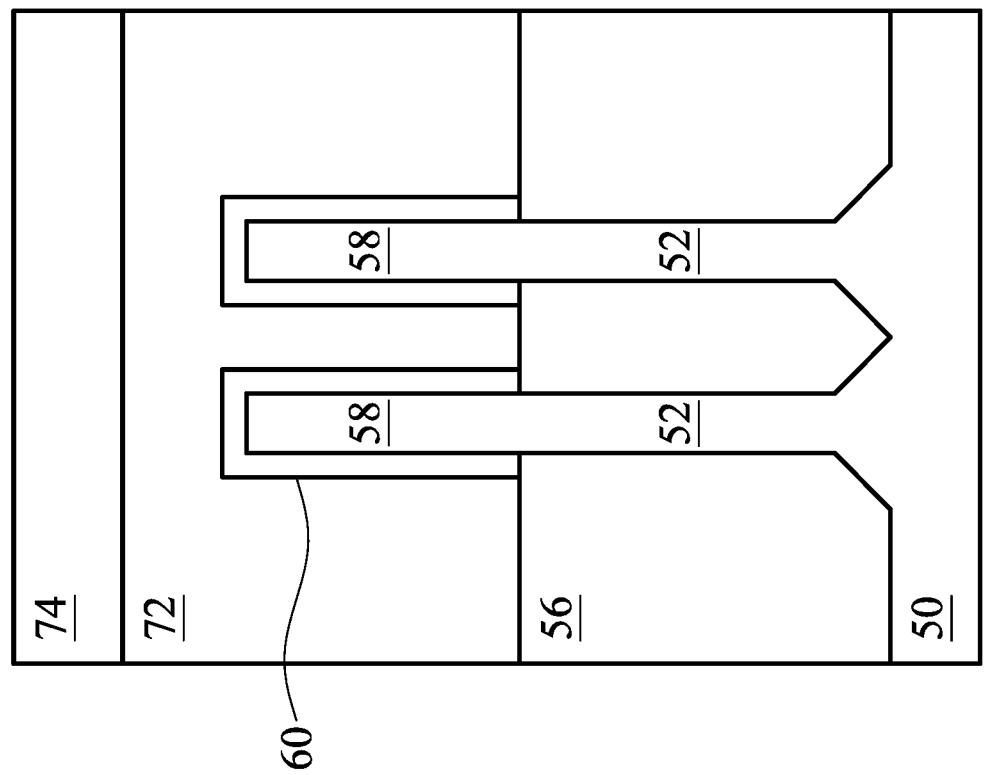
Figure 10D:
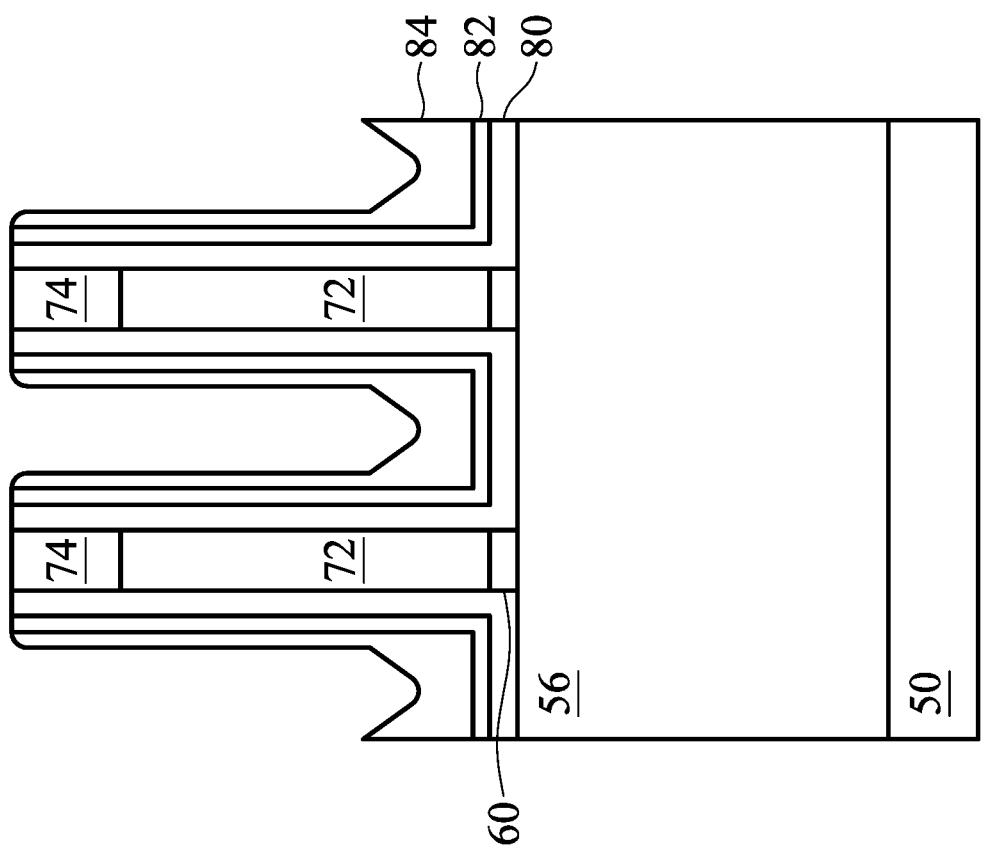
Figure 10C:
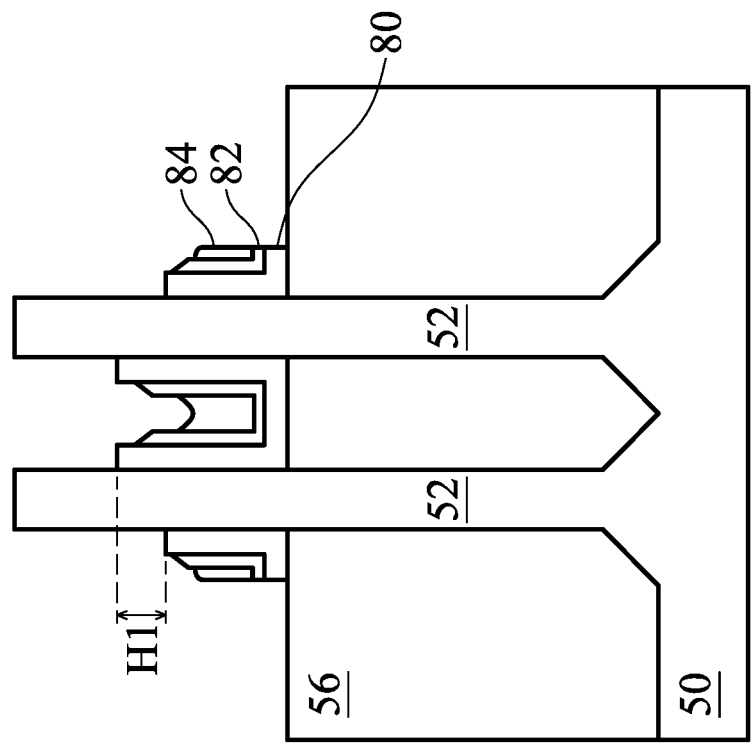

In FIGS. 10A-10D, the first gate spacers 80, the second gate spacers 82, and the third gate spacers 84 are etched. The first gate spacers 80, the second gate spacers 82, and the third gate spacers 84 may be etched by an anisotropic etch processes, such as RIE, NBE, or the like. As illustrated in FIGS. 10B-10D, residual portions of the first gate spacers 80, the second gate spacers 82, and the third gate spacers 84 may remain adjacent the fins 52 and between portions of the dummy gate stacks 76. As illustrated in FIG. 10D, bottom portions of the third gate spacers 84 may be generally V-shaped. This shape may be attributed to the dummy gate stacks 76 blocking portions of the etchants used to etch the third gate spacers 84 from reaching the bottom portions of the third gate spacers 84. The first gate spacers 80, the second gate spacers 82, and the third gate spacers 84 may be formed and etched in any desired order. For example, in an embodiment, the first gate spacers 80 may be formed and etched before forming the second gate spacers 82 and the third gate spacers 84.

FIG. 10C further illustrates that there may be a height difference H1 between remaining portions of the first gate spacers 80 and the second gate spacers 82 in areas between the fins 52 and the remaining portions of the first gate spacers 80 and the second gate spacer 82 in areas outside of the fins 52. The height difference H1 may be from about 0 nm to about 10 nm, such as about 5 nm. The etch processes used to etch the first gate spacers 80, the second gate spacers 82, and the third gate spacers 84 may be somewhat isotropic, which may cause the areas between the fins 52 (etched from the top down) to be etched at a lower rate than the areas outside of the fins (etched from the top down and from the sides). The height difference H1 may also be caused by the etchants used to etch the first gate spacers 80, the second gate spacers 82, and the third gate spacers 84 penetrating the areas outside of the fins 52 more readily than the areas between the fins 52. Further, the portions of the third gate spacers 84 which are merged in FIGS. 9C and 9D may take longer to remove by etching than unmerged portions of the third gate spacers 84. Therefore, portions of the third gate spacers 84 may remain between the fins 52 and between the dummy gate stacks 76, as illustrated in FIGS. 10C and 10D.

Implants for lightly doped source/drain (LDD) regions (not explicitly illustrated) may be performed at any time during the formation and etching of the first gate spacers 80, the second gate spacers 82, and the third gate spacers 84. For example, in some embodiments, the LDD regions may be implanted after forming the first gate spacers 80, before forming the second gate spacers 82 and the third gate spacers 84. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

In FIGS. 11A-11E epitaxial source/drain regions 92 are formed in the recesses 90 of the fins 52. The epitaxial source/drain regions 92 may exert stress in the respective channel regions 58, thereby improving performance. The epitaxial source/drain regions 92 are formed in the fins 52 such that each dummy gate 72 is disposed between respective neighboring pairs of the epitaxial source/drain regions 92. In some embodiments the epitaxial source/drain regions 92 may extend into, and may also penetrate through, the fins 52. In some embodiments, the first gate spacers 80, the second gate spacers 82, and the third gate spacers 84 are used to separate the epitaxial source/drain regions 92 from the dummy gates 72 by an appropriate lateral distance so that the epitaxial source/drain regions 92 do not short out subsequently formed gates of the resulting FinFETs.

The epitaxial source/drain regions 92 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 92 in the region 50N are epitaxially grown in the recesses. The epitaxial source/drain regions 92 may include any acceptable material, such as appropriate for n-type FinFETs. For example, if the fin 52 is silicon, the epitaxial source/drain regions 92 in the region 50N may include materials exerting a tensile strain in the channel region 58, such as silicon, SiC, SiCP, SiP, or the like. The epitaxial source/drain regions 92 in the region 50N may have surfaces raised from respective surfaces of the fins 52 and may have facets.

The epitaxial source/drain regions 92 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 92 in the region 50P are epitaxially grown in the recesses. The epitaxial source/drain regions 92 may include any acceptable material, such as appropriate for p-type FinFETs. For example, if the fin 52 is silicon, the epitaxial source/drain regions 92 in the region 50P may comprise materials exerting a compressive strain in the channel region 58, such as SiGe, SiGeB, Ge, GeSn, or the like. The epitaxial source/drain regions 92 in the region 50P may also have surfaces raised from respective surfaces of the fins 52 and may have facets.

The epitaxial source/drain regions 92 and/or the fins 52 may be implanted with dopants to form source/drain regions, similar to the process previously discussed for forming lightly-doped source/drain regions, followed by an anneal. The epitaxial source/drain regions 92 may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 92 may be in situ doped during growth.

Figure 11B:
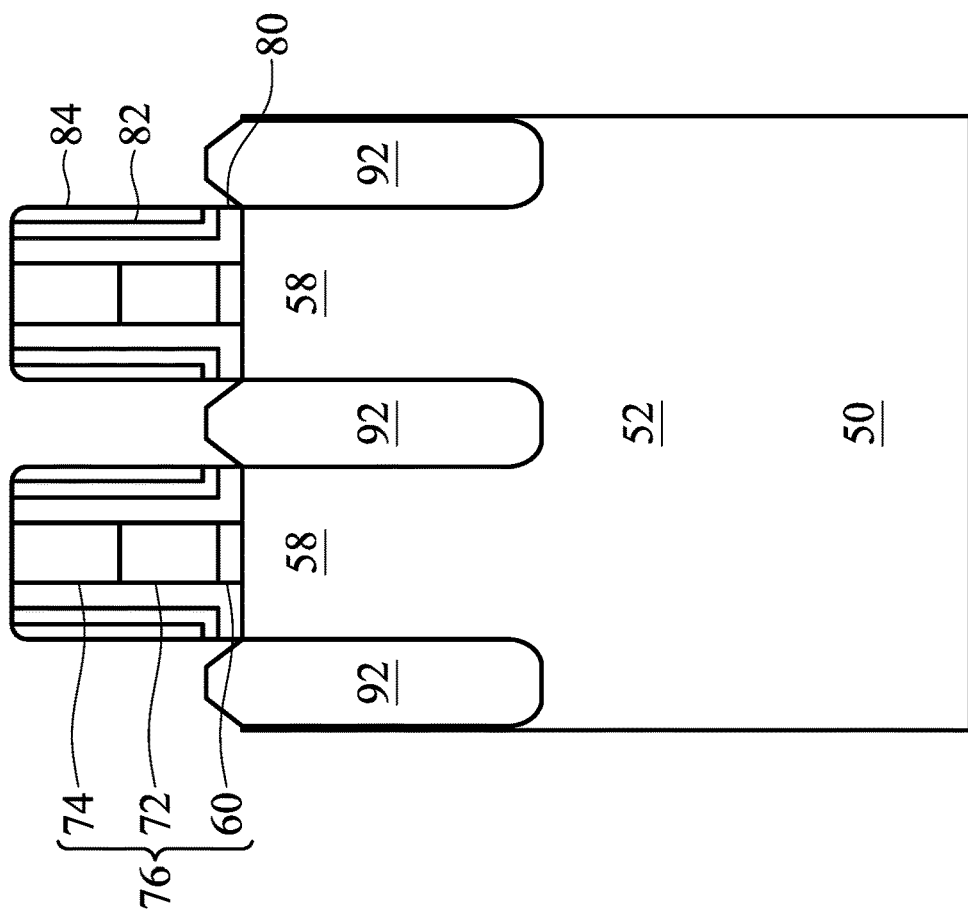
Figure 11A:
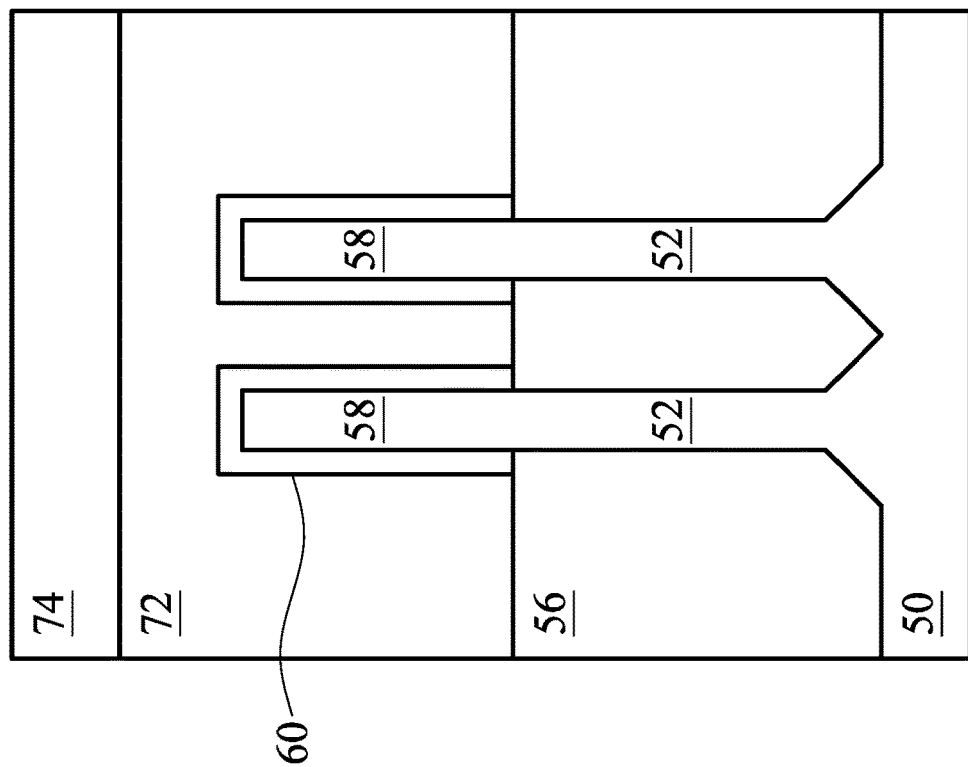
Figure 11D:
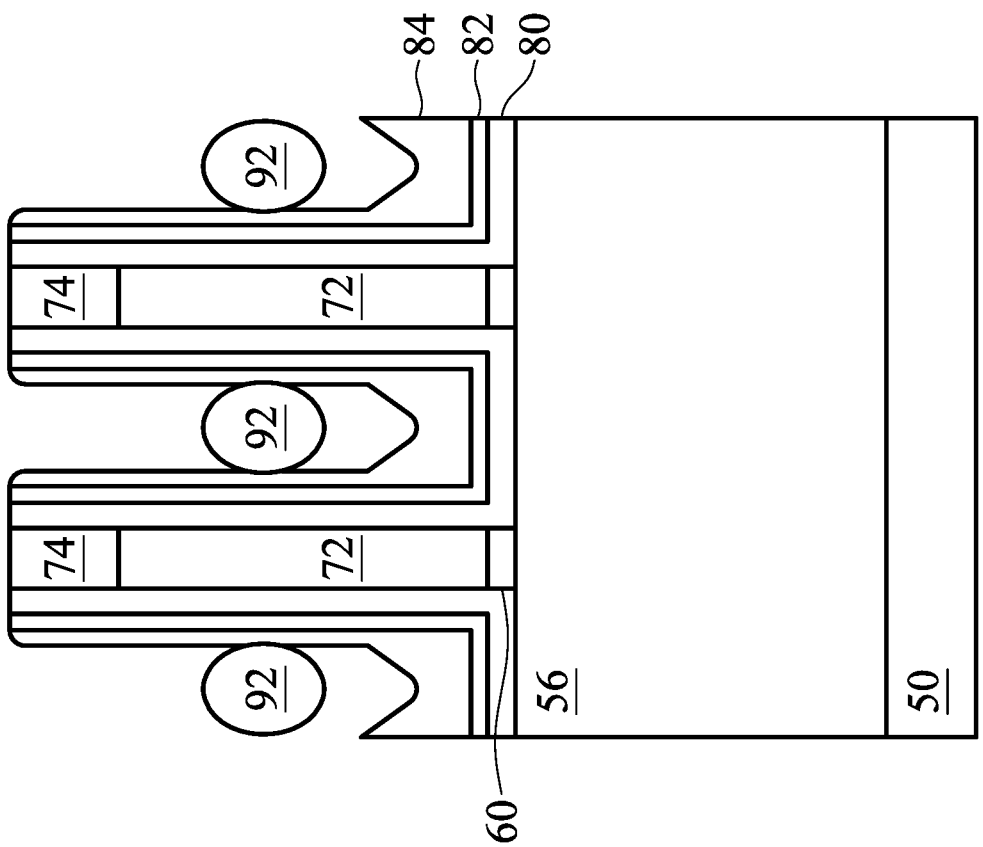
Figure 11C:
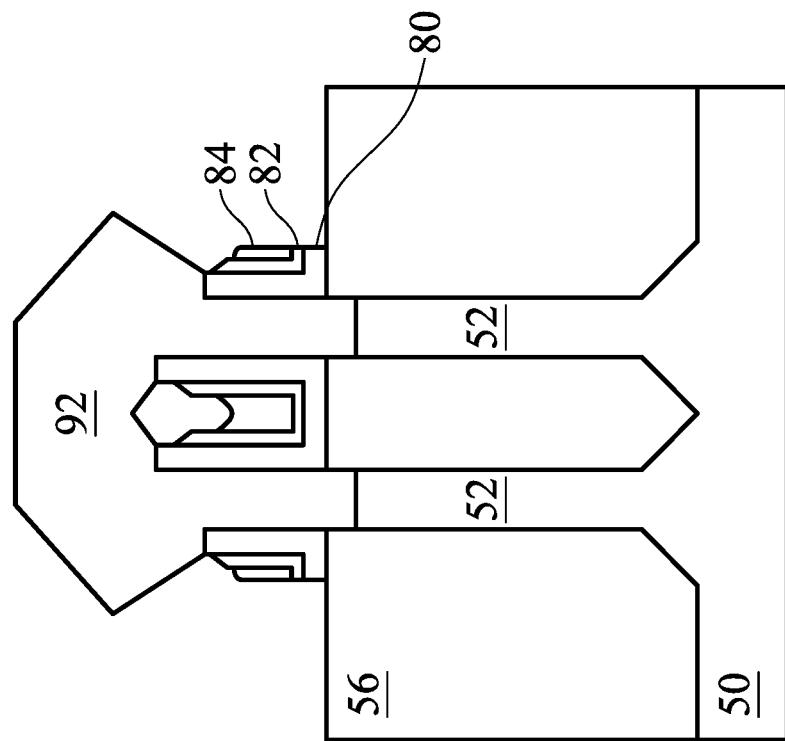
Figure 11E:
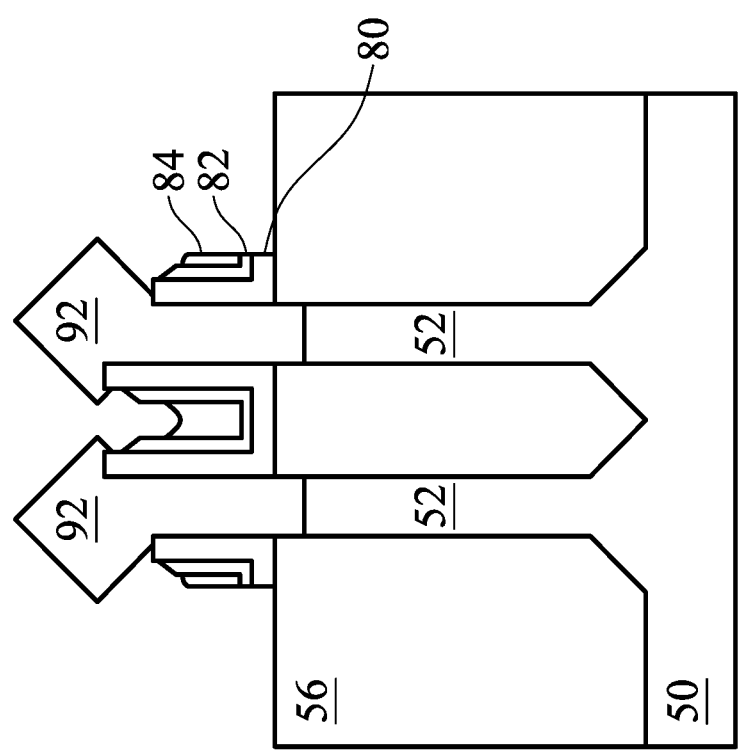

As a result of the epitaxy processes used to form the epitaxial source/drain regions 92 in the region 50N and the region 50P, upper surfaces of the epitaxial source/drain regions have facets which expand laterally outward beyond sidewalls of the fins 52. In some embodiments, these facets cause adjacent epitaxial source/drain regions 92 of a same FinFET to merge as illustrated by FIG. 11C. FIG. 11D illustrated a cross-sectional view of the merged portions of the epitaxial source/drain regions 92, which, as illustrated, may have a generally round shape, such as a circular shape or an oval shape. As illustrated in FIGS. 11C and 11D, portions of the residual portions of the first gate spacers 80, the second gate spacers 82, and the third gate spacers 84 may be disposed below the merged portions of the epitaxial source/drain regions 92. In other embodiments, such as the embodiment illustrated in FIG. 11E, adjacent epitaxial source/drain regions 92 remain separated after the epitaxy process is completed.

Figure 12B:
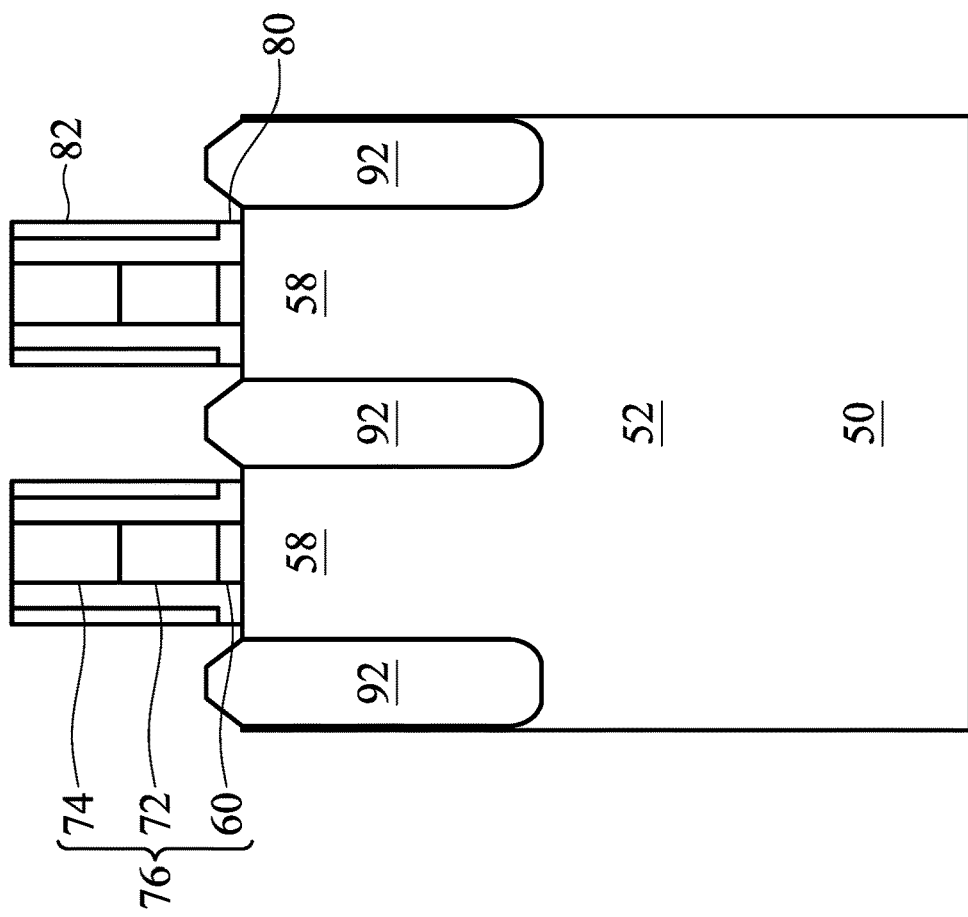
Figure 12A:
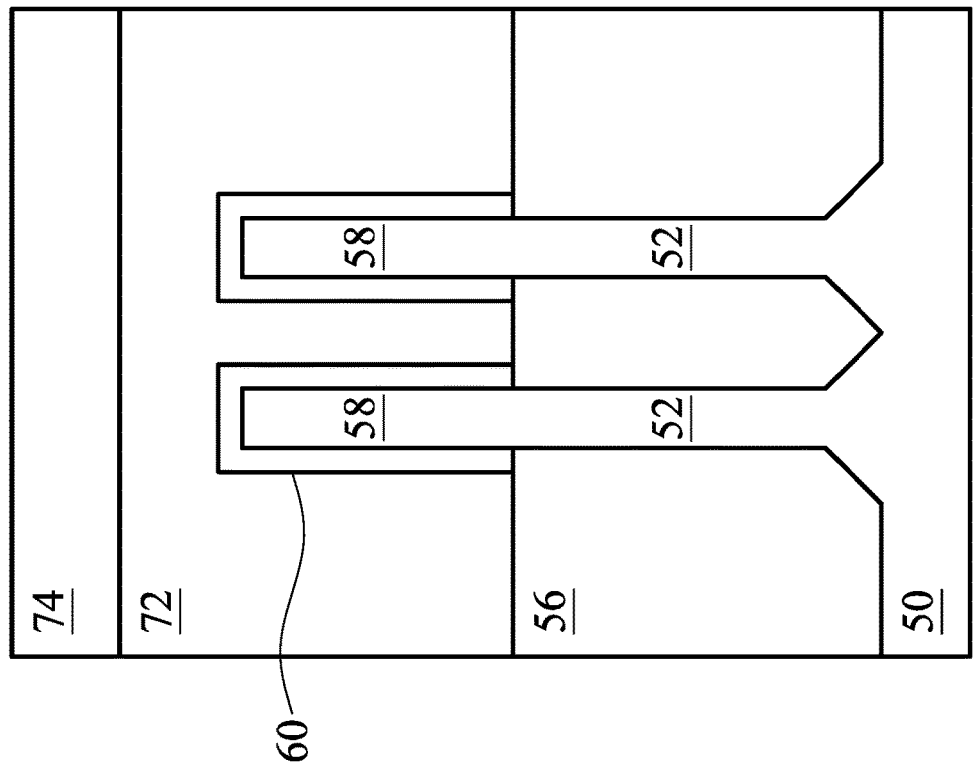
Figure 12D:
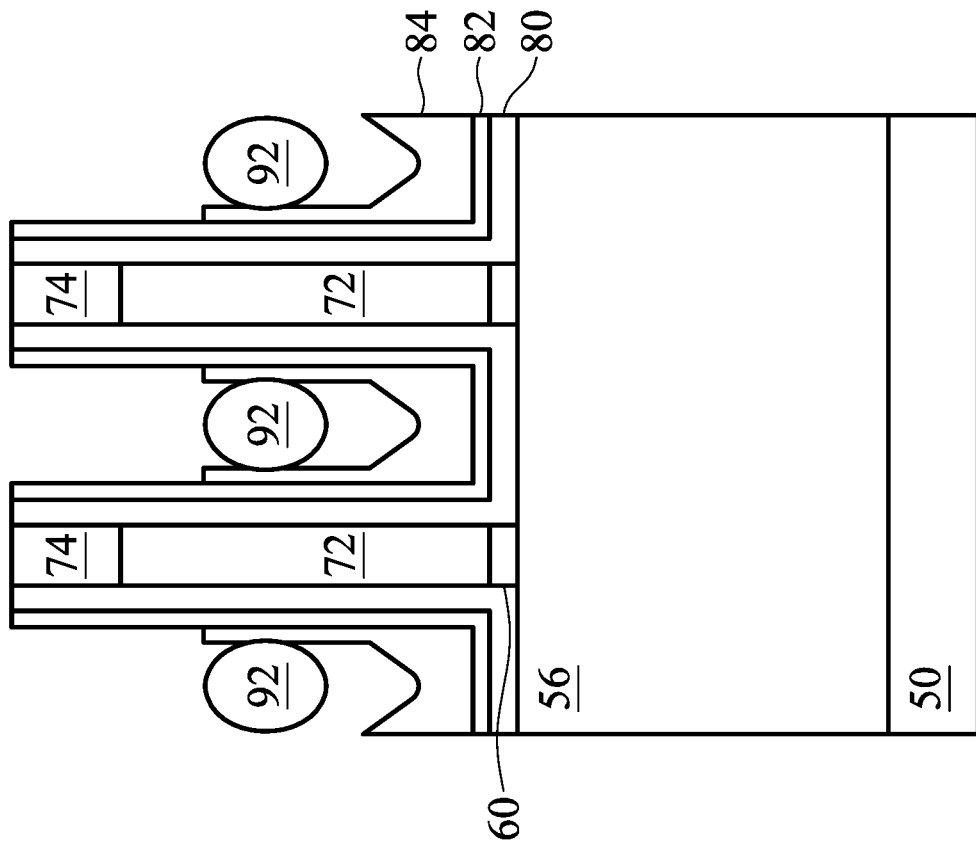
Figure 12C:
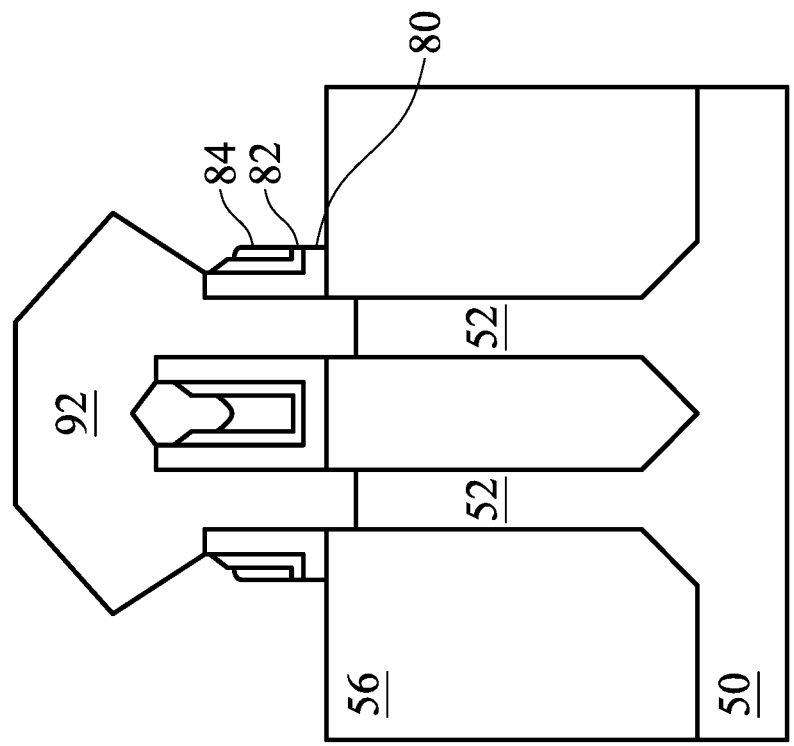

In FIGS. 12A-12D, portions of the third gate spacers 84 are removed. The portions of the third gate spacers 84 may be removed using an isotropic or an anisotropic etch process. In some embodiments, the portions of the third gate spacers 84 may be removed using a wet etching process using phosphoric acid or the like as an etchant. In further embodiments, the portions of the third gate spacers 84 may be etching using fluorine-based gases, chlorine-based gases, mixtures of HBr, He, and $O_2$, combinations thereof, or the like. Portions of the first gate spacers 80 and the second gate spacers 82 disposed under the third gate spacers 84 may also be removed. As illustrated in FIGS. 12C and 12D, portions of the third gate spacers 84 disposed outside the merged portions of the epitaxial source/drain regions 92 may be removed, while portions of the third gate spacers 84 disposed between or beneath the merged portions of the epitaxial source/drain regions 92 and between the dummy gate stacks 76 may remain. The portions of the third gate spacers 84 disposed between or beneath the merged portions of the epitaxial source/drain regions 92 may be sealed by the epitaxial source/drain regions 92 and the etchants may not penetrate these areas. The third gate spacers 84 may be formed of a material having a high permittivity and the remaining portion of the third gate spacers 84 may increase parasitic capacitance. As a result, it is desirable to remove the remaining portion of the third gate spacers 84, as will be discussed in greater detail below, to reduce parasitic capacitance and improve device speed for the subsequently formed device.

In FIGS. 13A-13D, a first ILD 96 is deposited over the structure illustrated in FIGS. 12A-12D. The first ILD 96 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a first contact etch stop layer (CESL) 94 is disposed between the first ILD 96 and the epitaxial source/drain regions 92, the masks 74, the first gate spacers 80, the second gate spacers 82, and the third gate spacers 84. The first CESL 94 may comprise a dielectric material, such as, silicon nitride, silicon oxide, silicon oxynitride, or the like, having a different etch rate than the material of the overlying first ILD 96. In a particular embodiment, the first CESL 94 may comprise silicon carbon nitride and the first ILD 96 may comprise silicon oxide.

Figure 13B:
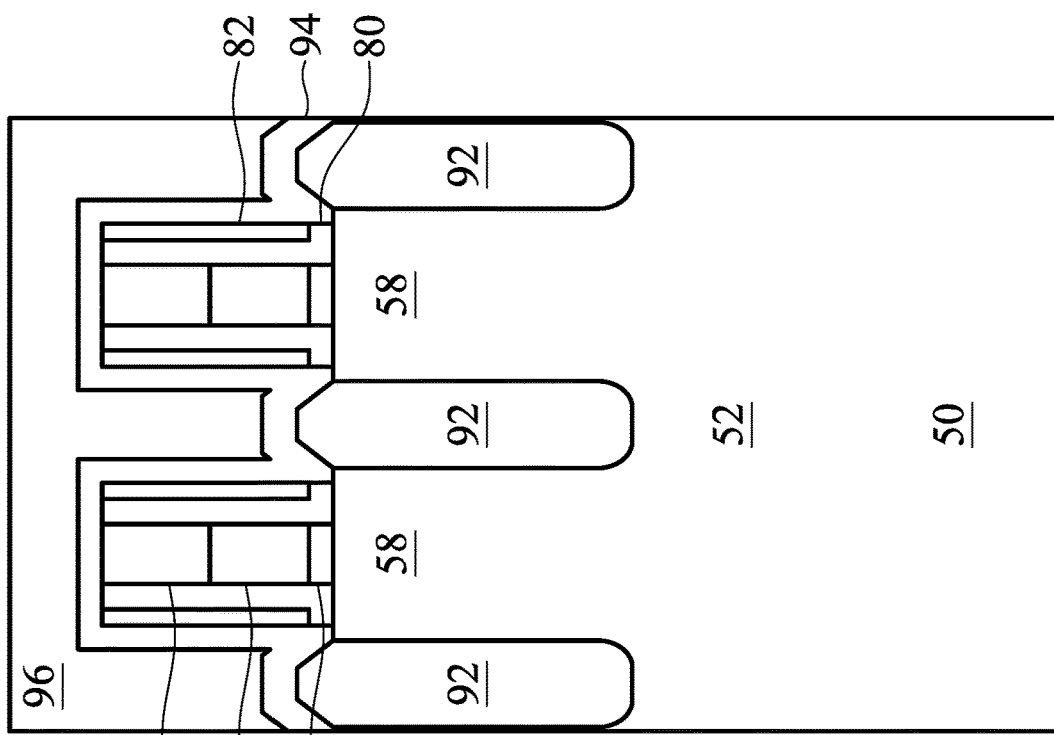
Figure 13A:
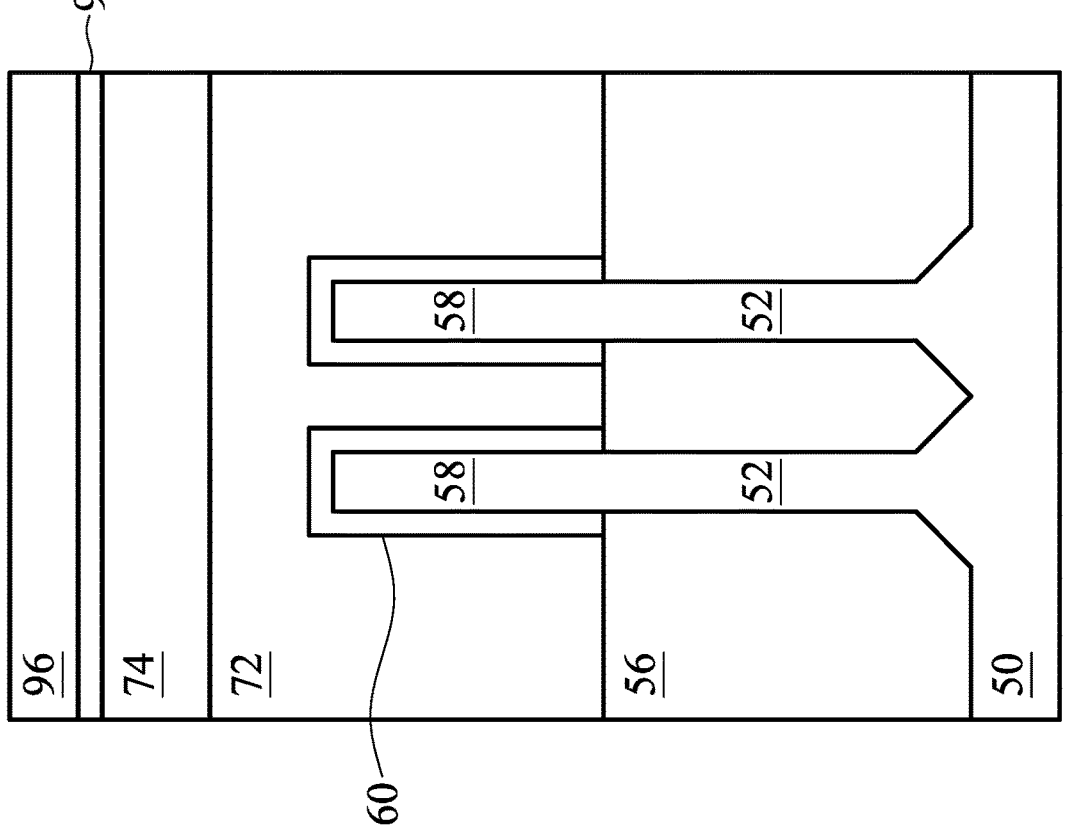
Figure 13D:
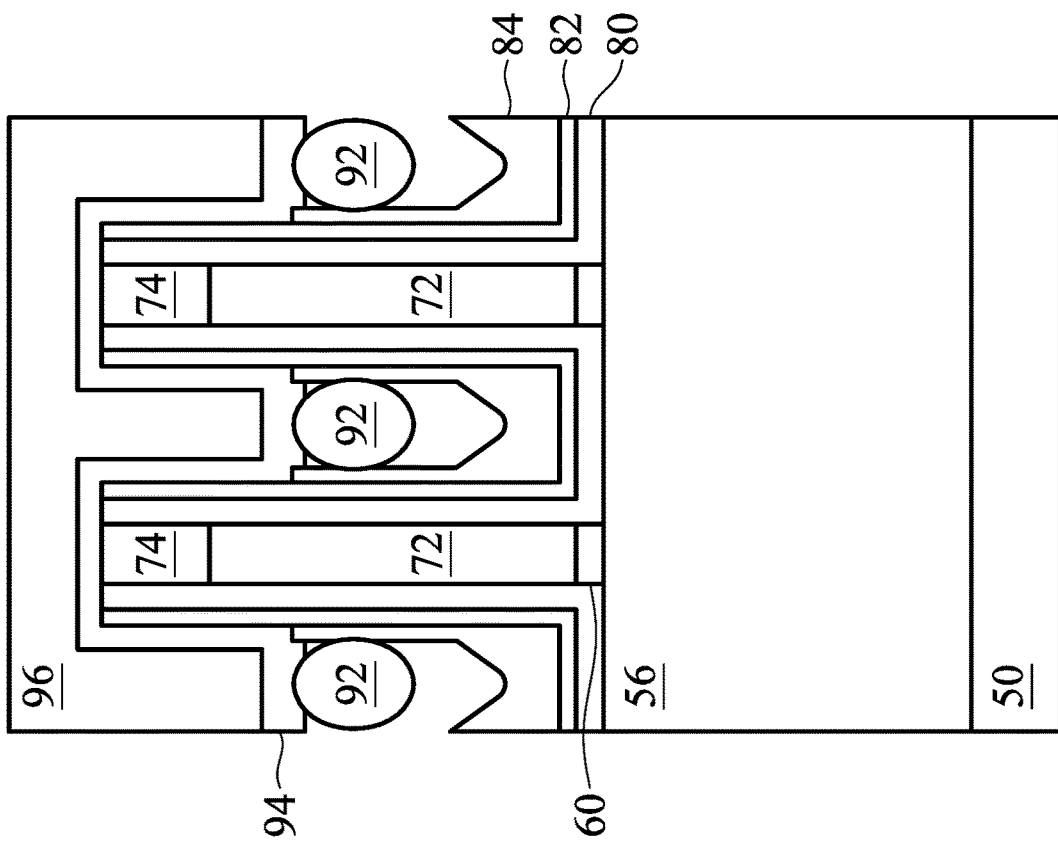
Figure 13C:
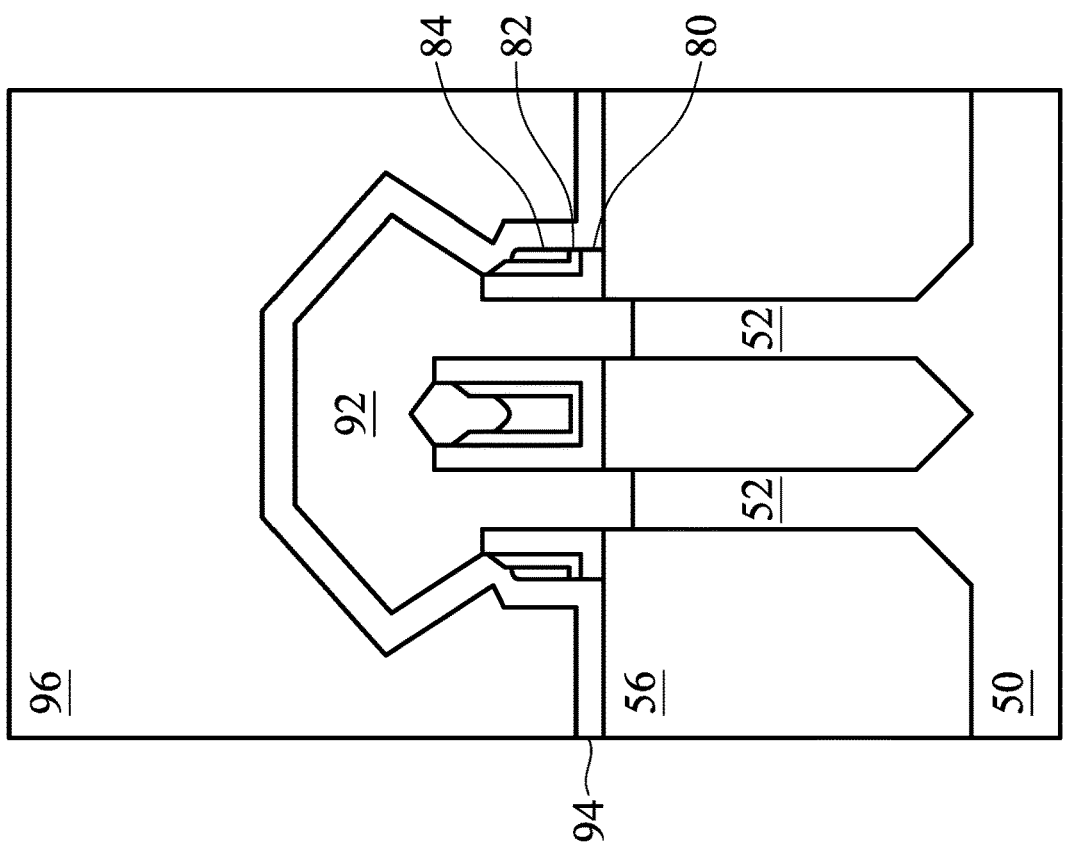
Figure 14B:
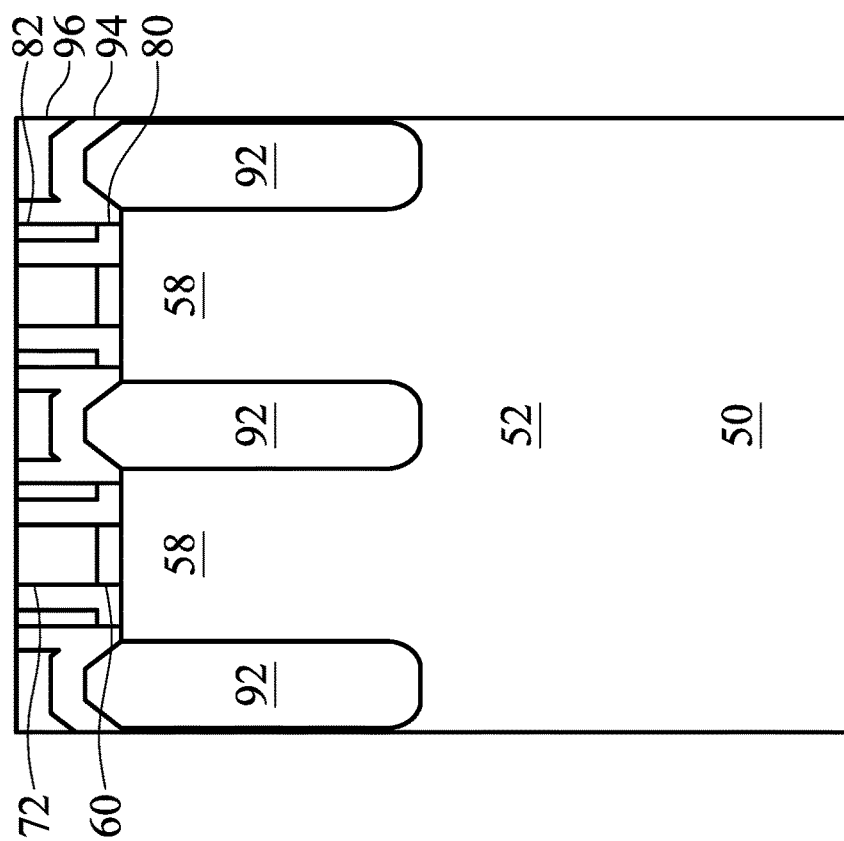
Figure 14A:
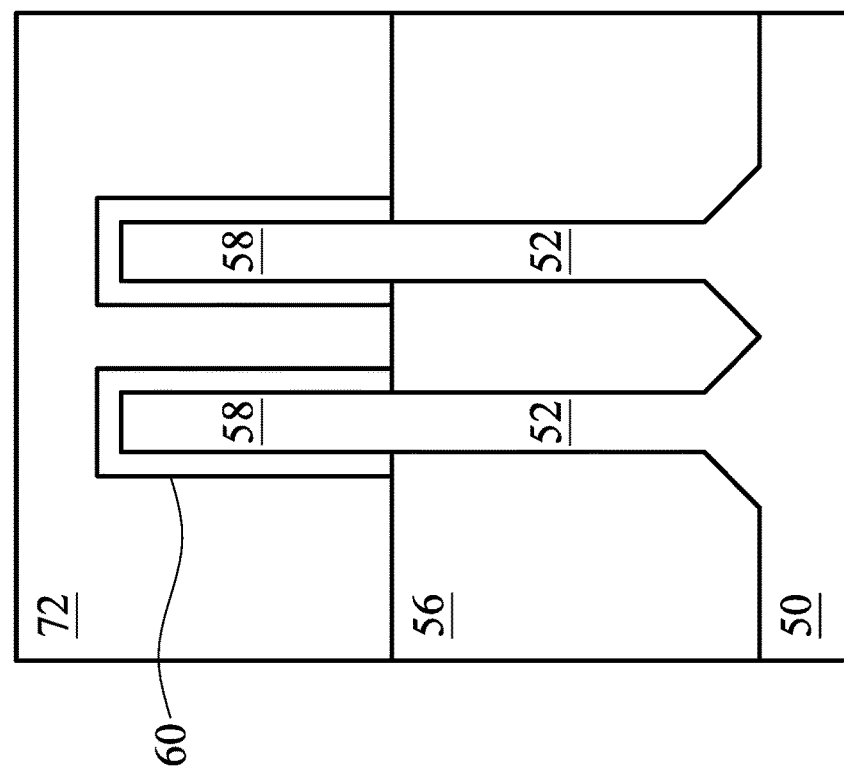
Figure 14C:
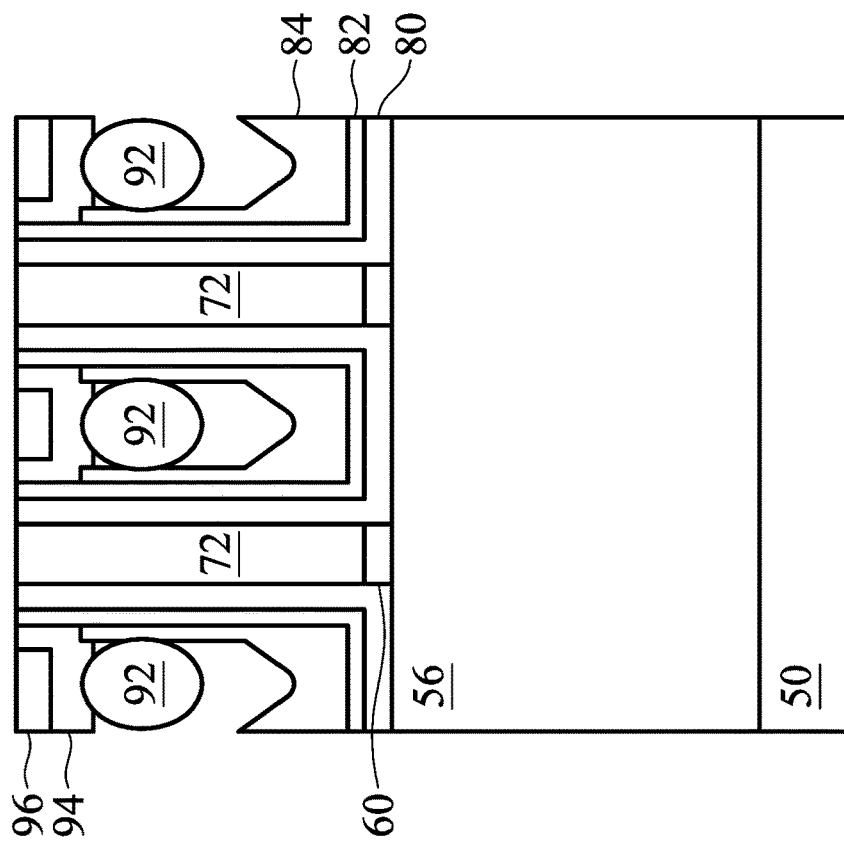
Figure 14D:
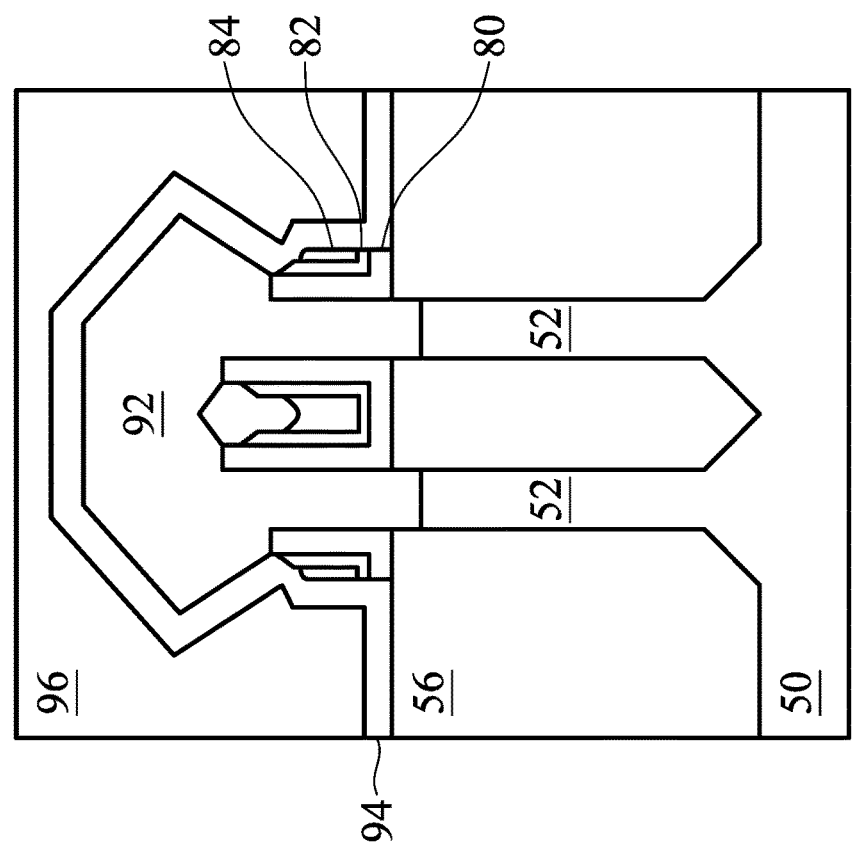

The first CESL 94 may be deposited by a conformal deposition method, such as CVD, ALD, or the like. The opening disposed between the merged epitaxial source/drain regions 92 may be sealed by the epitaxial source/drain regions 92 such that the first CESL 94 is not deposited in the opening. Moreover, the process used to deposit the first CESL may not be completely conformal such that openings are disposed between portions of the epitaxial source/drain regions 92 and the first CESL 94, as illustrated in FIG. 13D.

In FIGS. 14A-14D, a planarization process, such as a CMP, may be performed to level the top surface of the first ILD 96 with the top surfaces of the dummy gates 72 or the masks 74. The planarization process may also remove the masks 74 on the dummy gates 72, and portions of the first gate spacers 80 and the second gate spacers 82 along sidewalls of the masks 74. After the planarization process, top surfaces of the dummy gates 72, the first gate spacers 80, the second gate spacers 82, the first CESL 94, and the first ILD 96 are level. Accordingly, the top surfaces of the dummy gates 72 are exposed through the first ILD 96. In some embodiments, the masks 74 may remain, in which case the planarization process levels the top surface of the first ILD 96 with the top surfaces of the top surface of the masks 74.

In FIGS. 15A-15D, the dummy gates 72, and the masks 74 if present, are removed in an etching step(s), so that recesses 100 are formed. Portions of the dummy dielectric layer 60 in the recesses 100 may also be removed. In some embodiments, only the dummy gates 72 are removed and the dummy dielectric layer 60 remains and is exposed by the recesses 100. In some embodiments, the dummy dielectric layer 60 is removed from recesses 100 in a first region of a die (e.g., a core logic region) and remains in recesses 100 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 96, the first CESL 94, the first gate spacers 80, or the second gate spacers 82. Each recess 100 exposes a channel region 58 of a respective fin 52. Each channel region 58 is disposed between neighboring pairs of the epitaxial source/drain regions 92. During the removal, the dummy dielectric layer 60 may be used as an etch stop layer when the dummy gates 72 are etched. The dummy dielectric layer 60 may then be optionally removed after the removal of the dummy gates 72.

Figure 15B:
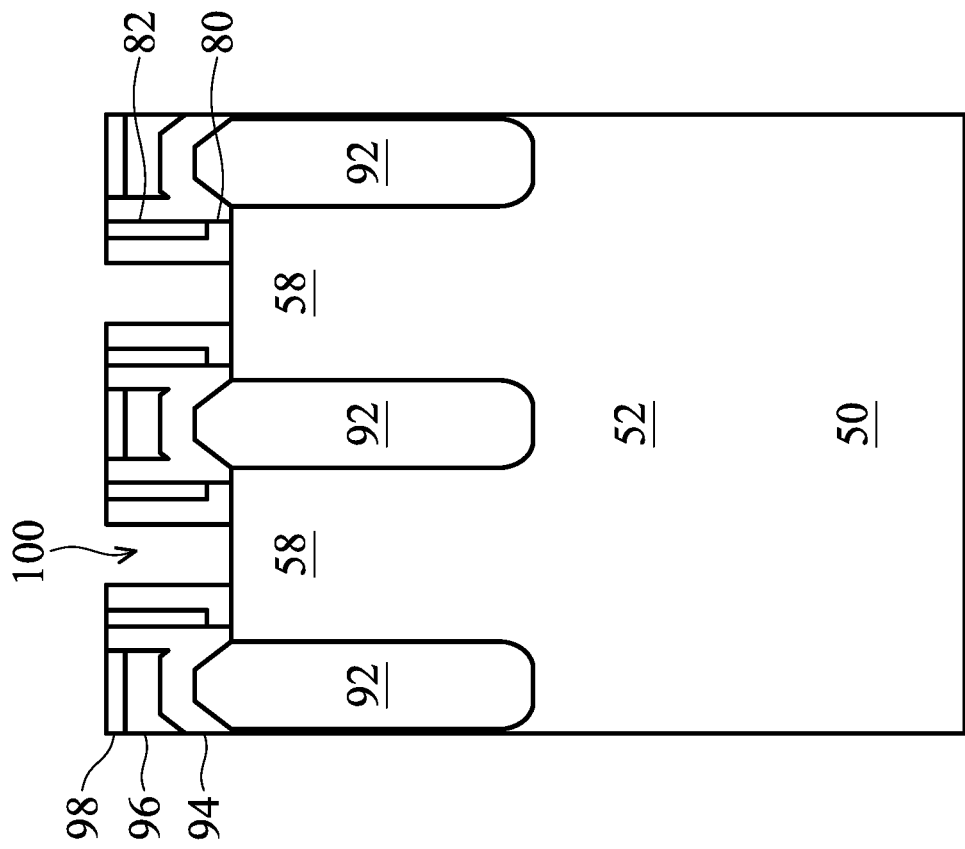
Figure 15A:
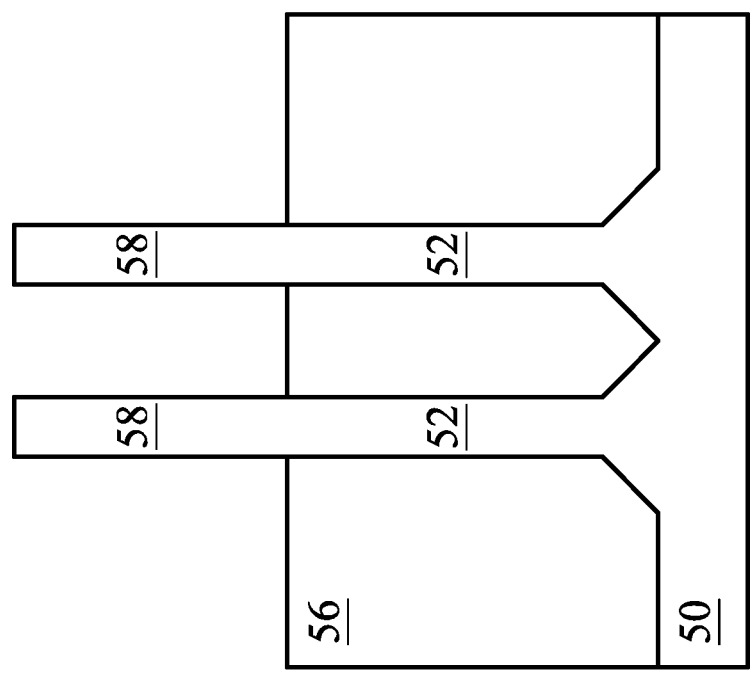
Figure 15D:
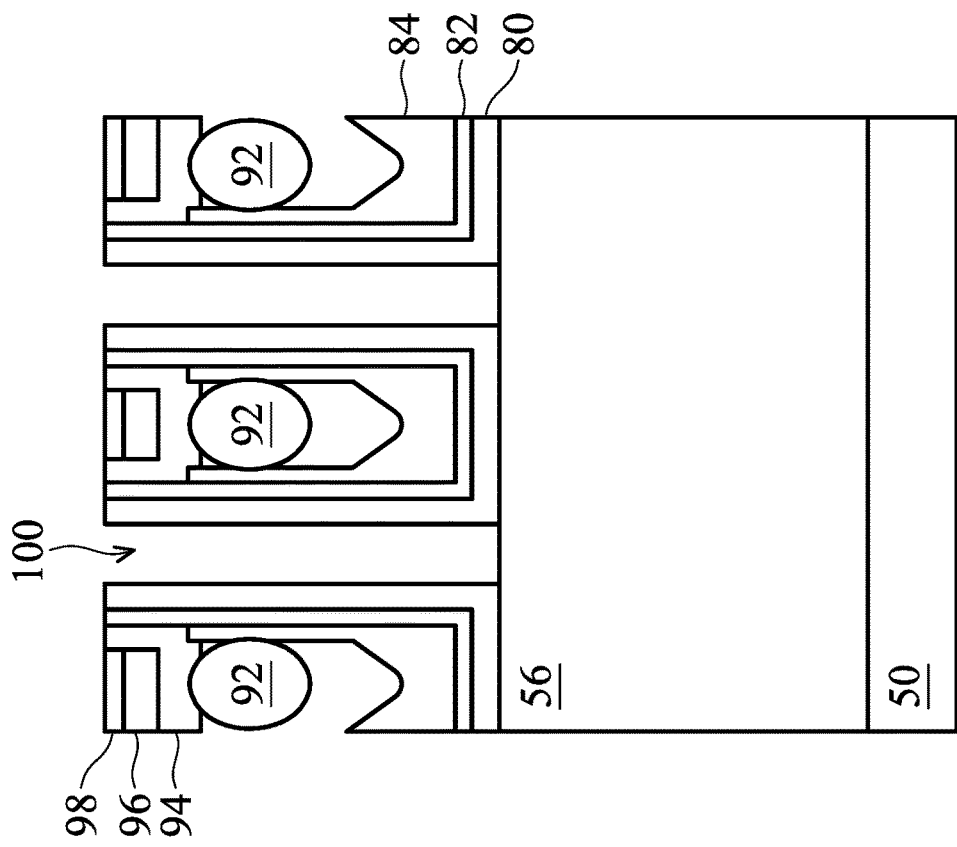
Figure 15C:
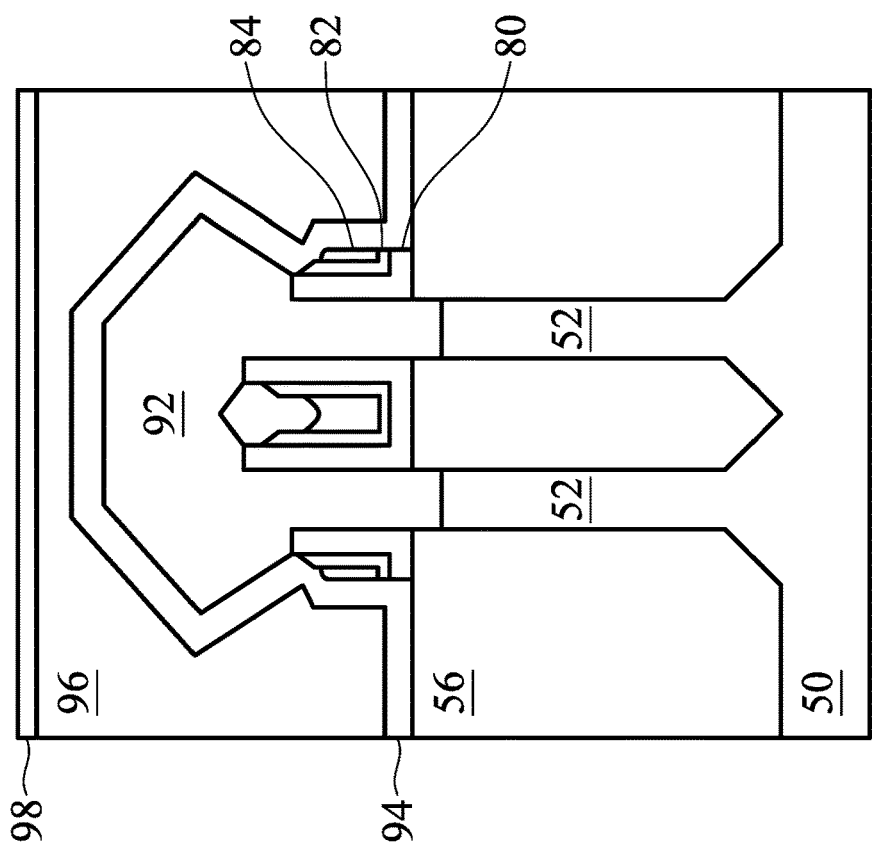

FIGS. 15A-15D further illustrate a formation of a hard mask 98 over the first ILD 96. The hard mask 98 may be formed by etching back the first ILD 96. The first ILD 96 is etched back using an anisotropic etch process, such as RIE, NBE, or the like, or an isotropic etch process, such as a wet etch process. The hard mask 98 may then be deposited over the resulting structure using CVD, PECVD, ALD, sputtering, or the like, and planarized using a process such as CMP. As illustrated in FIG. 15C, a portion of the first ILD 96 may remain between the hard mask 98 and the underlying first CESL 94 and epitaxial source/drain regions 92. As illustrated in FIG. 15D, top surfaces of the hard mask 98 may be level with top surfaces of the first CESL 94, the first gate spacers 80, and the second gate spacers 82 following the planarization of the hard mask 98. The hard mask 98 may be formed before or after the dummy gates 72 and the masks 74 are removed. The hard mask 98 may be formed of a material such as amorphous silicon, SiOC, SiC, carbon-doped semiconductor materials, or the like and may have a thickness of from about 5 nm to about 10 nm, such as about 10 nm. In specific embodiments, the hard mask 98 may comprise carbon-doped silicon oxide. The hard mask 98 may be formed over the first ILD 96 in order to protect the first ILD 96 from the etching process used to remove the second gate spacers 82 and the third gate spacers 84 (discussed below in reference to FIGS. 17A-17D).

Figure 16B:
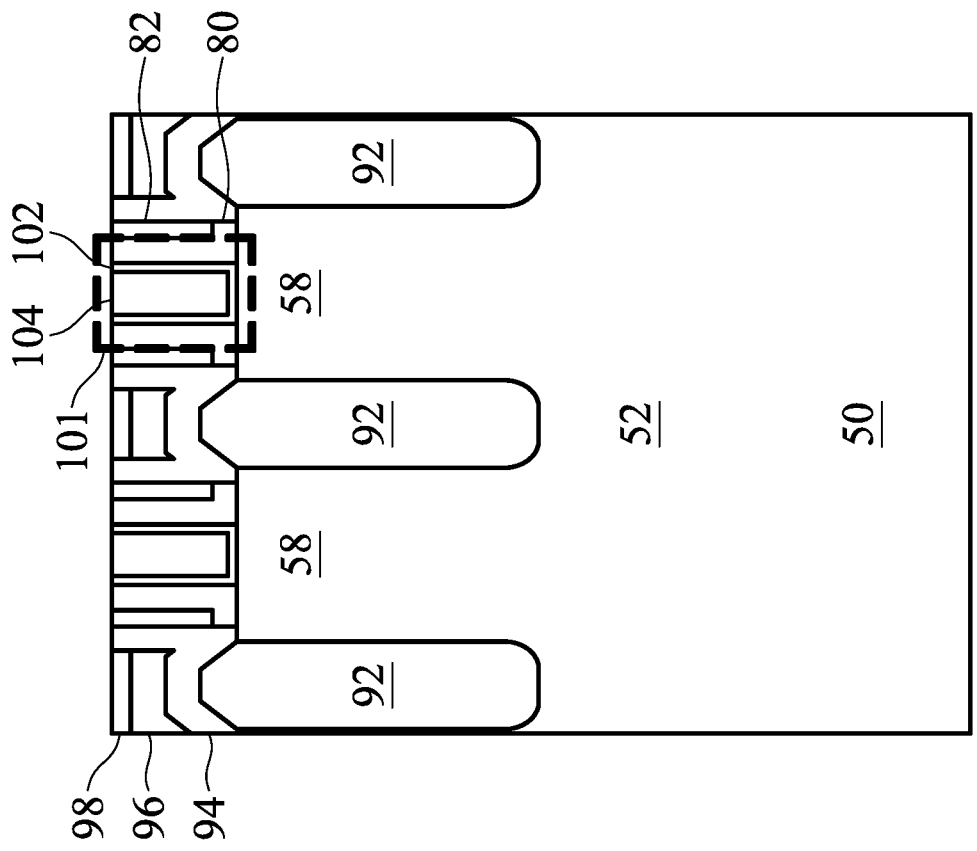
Figure 16A:
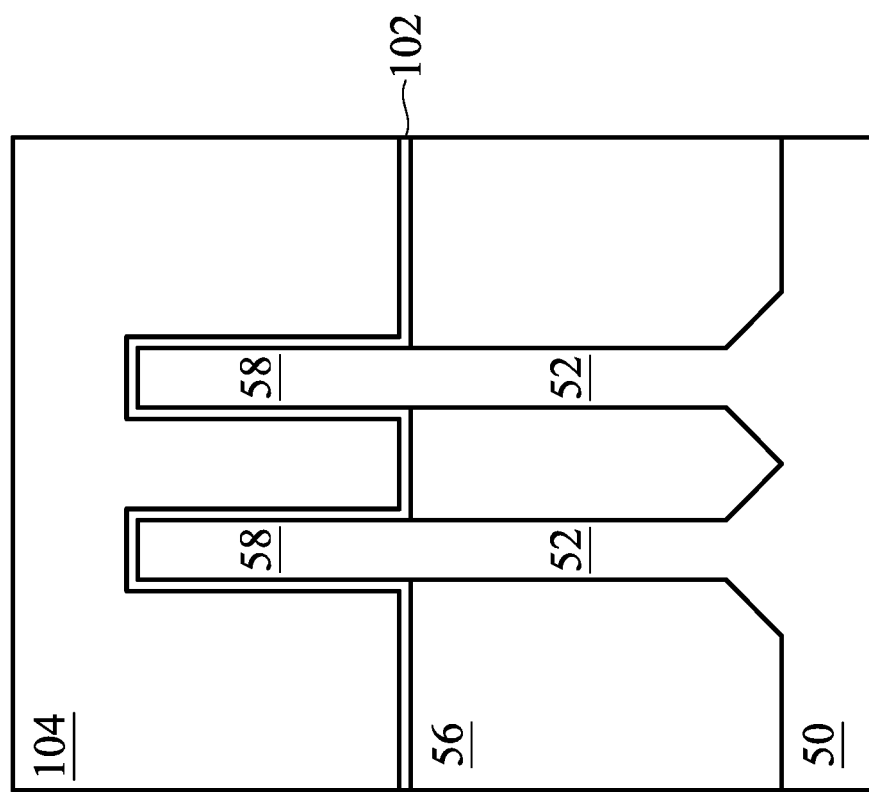
Figure 16E:
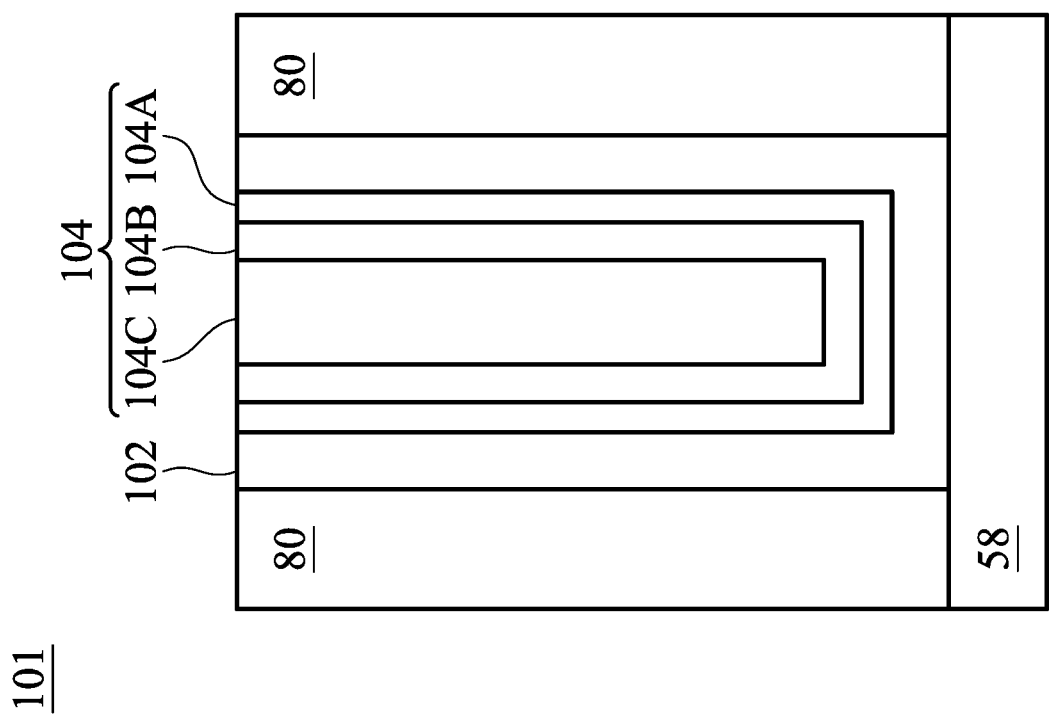
Figures 17A, 17B:
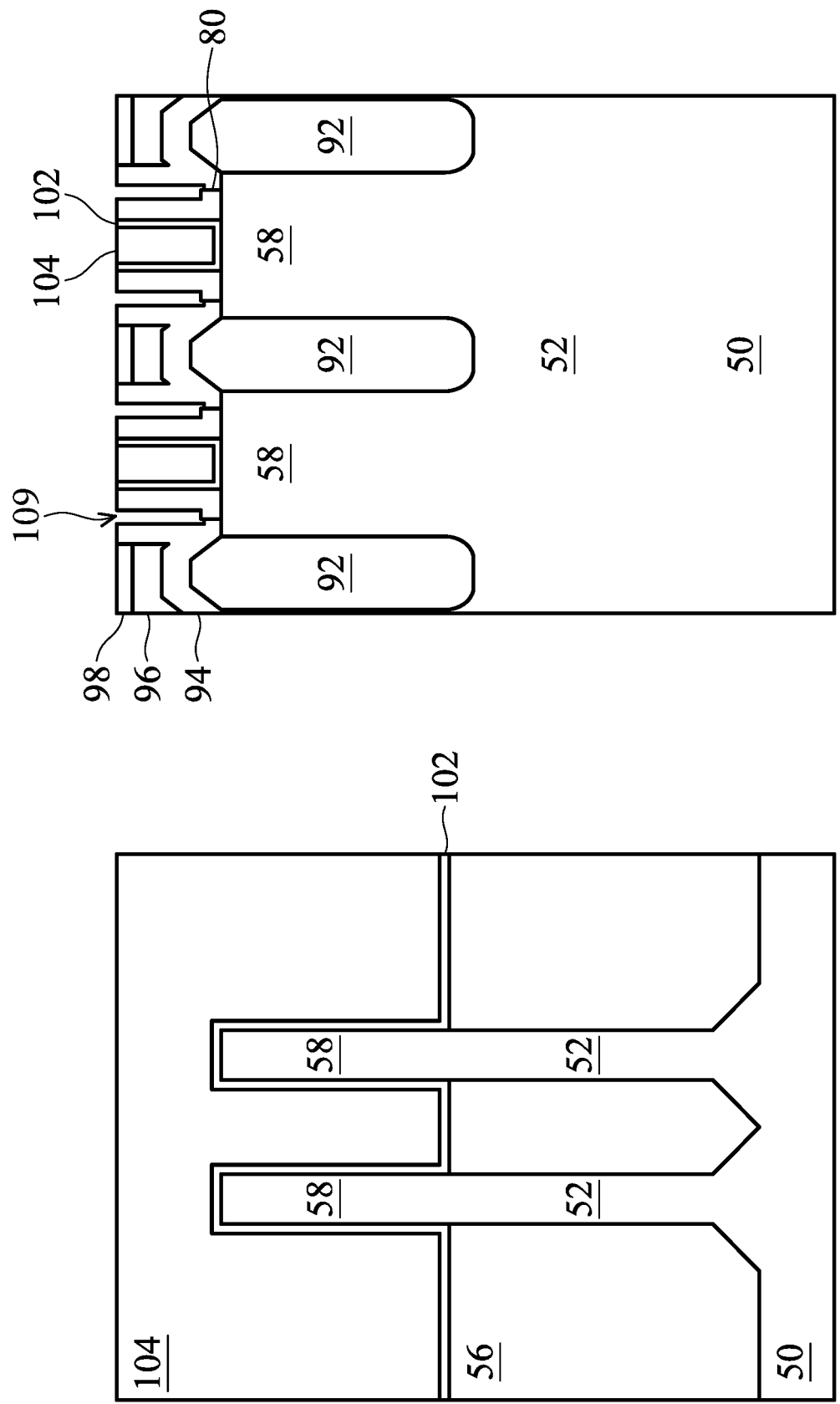
Figure 17D:
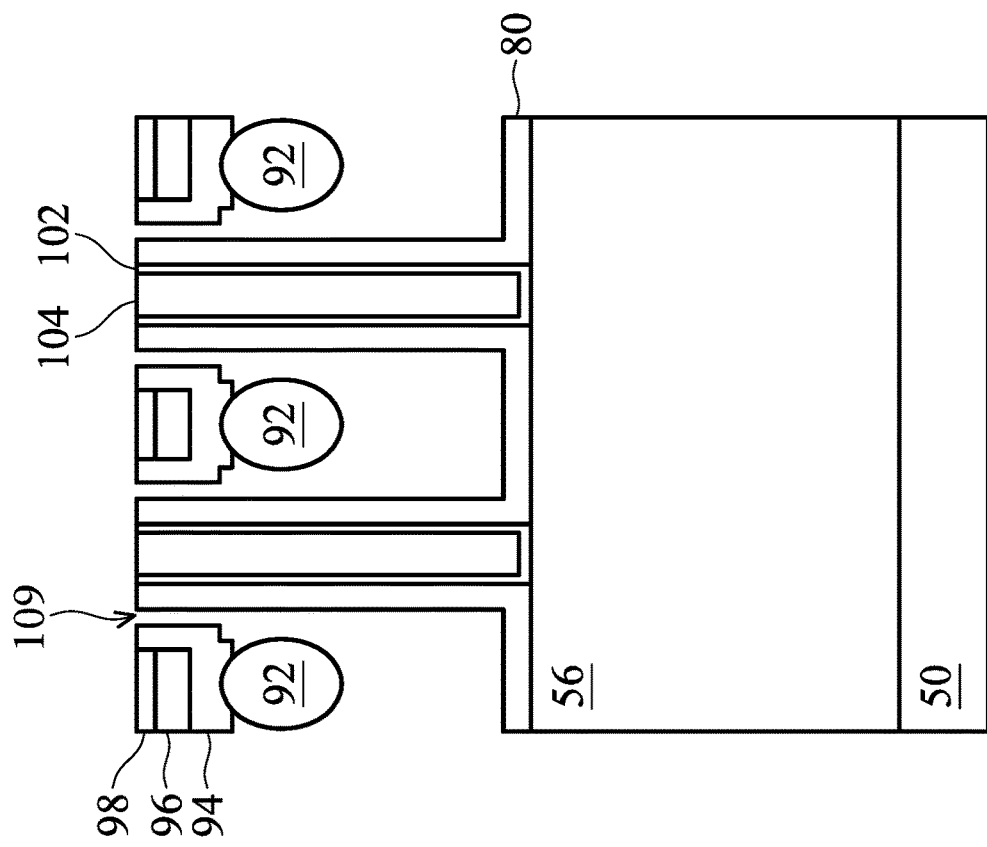
Figure 17C:
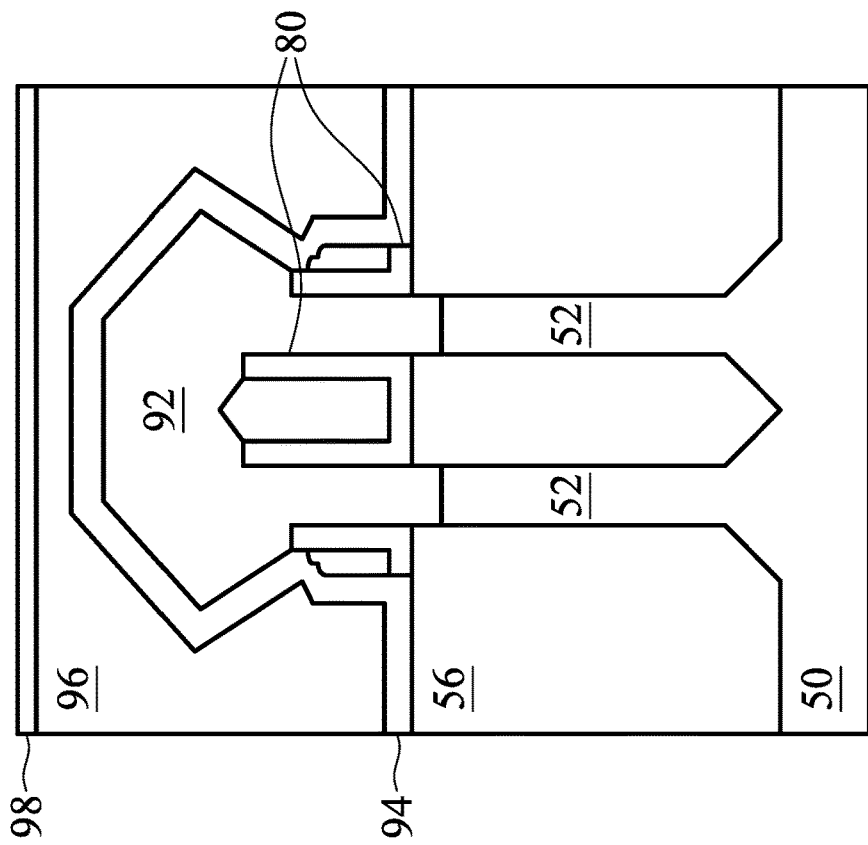

In FIGS. 16A-16E, gate dielectric layers 102 and gate electrodes 104 are formed for replacement gates. FIG. 16E illustrates a detailed view of region 101 of FIG. 16B. Gate dielectric layers 102 are deposited conformally in the recesses 100 (illustrated in FIGS. 15B and 15D), such as on the top surfaces and the sidewalls of the fins 52 and on sidewalls of the first gate spacers 80. The gate dielectric layers 102 may also be formed on top surfaces of the hard mask 98, the first CESL 94, and STI regions 56. In accordance with some embodiments, the gate dielectric layers 102 comprise silicon oxide, silicon nitride, or multilayers thereof. In some embodiments, the gate dielectric layers 102 include a high-k dielectric material, and in these embodiments, the gate dielectric layers 102 may have a k value greater than about 7.0, and may include a metal oxide or a silicate of Hf, Al, Zr, La, Mg, Ba, Ti, Pb, and combinations thereof. The formation methods of the gate dielectric layers 102 may include molecular-beam deposition (MBD), ALD, PECVD, and the like. In embodiments where portions of the dummy dielectric layer 60 remain in the recesses 100, the gate dielectric layers 102 include a material of the dummy dielectric layer 60 (e.g., $SiO_2$).

The gate electrodes 104 are deposited over the gate dielectric layers 102, respectively, and fill the remaining portions of the recesses 100. The gate electrodes 104 may include a metal-containing material such as TiN, TiO, TaN, TaC, Co, Ru, Al, W, combinations thereof, or multi-layers thereof. For example, although a single layer gate electrode 104 is illustrated in FIGS. 16A, 16B, and 16D, the gate electrode 104 may comprise any number of liner layers 104A, any number of work function tuning layers 104B, and a fill material 104C as illustrated by FIG. 16E. After the filling of the gate electrodes 104, a planarization process, such as a CMP, may be performed to remove the excess portions of the gate dielectric layers 102 and the material of the gate electrodes 104, which excess portions are over the top surface of the hard mask 98. The remaining portions of material of the gate electrodes 104 and the gate dielectric layers 102 thus form replacement gates of the resulting FinFETs. The gate electrodes 104 and the gate dielectric layers 102 may be collectively referred to as a "gate stack." The gate and the gate stacks may extend along sidewalls of a channel region 58 of the fins 52.

The formation of the gate dielectric layers 102 in the region 50N and the region 50P may occur simultaneously such that the gate dielectric layers 102 in each region are formed from the same materials, and the formation of the gate electrodes 104 may occur simultaneously such that the gate electrodes 104 in each region are formed from the same materials. In some embodiments, the gate dielectric layers 102 in each region may be formed by distinct processes, such that the gate dielectric layers 102 may be different materials, and/or the gate electrodes 104 in each region may be formed by distinct processes, such that the gate electrodes 104 may be different materials. Various masking steps may be used to mask and expose appropriate regions when using distinct processes.

In FIGS. 17A-17D, the second gate spacers 82 and the remaining portions of the third gate spacers 84 are removed. The second gate spacers 82 may be removed to form openings 109 exposing the third gate spacers 84, and the third gate spacers 84 may be removed by etching through the openings 109. Any suitable process, such as an anisotropic etch process or an isotropic etch process may be used to etch the second gate spacers 82 and the third gate spacers 84. In some embodiments, the second gate spacers 82 and the third gate spacers 84 may be etched using a dry etch process, to avoid corrosion of the gate stack. In at least one embodiment, the second gate spacers 82 and the third gate spacers 84 may be removed using a dry etch process using a fluorine-based etch process, such as a process using vapor-phase hydrogen fluoride as an etchant. The dry etch process may be performed at a temperature of from about −4° C. to about 40° C., such as about −4° C.; at a pressure of from about 1 Torr to about 20 Torr, such as about 1 Torr; and for a period of from about 10 seconds to about 200 seconds, such as about 110 seconds.

The etch process used to remove the second gate spacers 82 and the third gate spacers 84 may have a high etch selectivity depending on the carbon concentration of materials exposed to the etch process. Specifically, the second gate spacers 82 and the third gate spacers 84 may be formed of materials having low concentrations of carbon, while the hard mask 98, the first CESL 94, and the first gate spacers 80 are formed of materials having higher concentrations of carbon. As such, the second gate spacers 82 and the third gate spacers 84 may be removed without removing the hard mask 98, the first CESL 94, and the first gate spacers 80. Portions of the hard mask 98, the first CESL 94, and the first gate spacers 80 exposed to the etch process may be thinned. Because the first ILD 96 is formed of silicon oxide, having a low concentration of carbon, the hard mask 98 is included to protect the first ILD from the etch process.

In further embodiments, the second gate spacers 82 and the third gate spacers 84 may be removed using two separate etching processes. For example, the second gate spacers 82 may be removed using the vapor-phase hydrogen fluoride etch described above and the third gate spacers may be removed using a wet etch process using phosphoric acid or the like as an etchant.

In FIGS. 18A-18E, a second CESL 106 is formed over the structure of FIGS. 17A-17D, which encloses gaseous spacers 108. The second CESL 106 may be formed by a conformal deposition process, such as CVD, ALD, or the like. In specific embodiments, the second CESL 106 may be deposited by a process having low conformity, such as plasma-enhanced CVD (PECVD). The second CESL 106 may comprise a dielectric material, such as, silicon nitride, silicon oxide, silicon oxynitride, or the like, having a different etch rate than a material of a subsequently formed second ILD 112 (discussed below with respect to FIGS. 20A and 20B). In a particular embodiment, the second CESL 106 may comprise silicon nitride. Although bottom surfaces of the second CESL 106 are illustrated as being flat, the bottom surfaces of the second CESL 106 may be curved. For example, in some embodiments, the bottom surfaces of the second CESL 106 may be convex or concave.

Because the second CESL 106 may be deposited using a process having poor conformity, the second CESL 106 may extend only partially into the openings 109 formed by the removal of the second gate spacers 82 and the third gate spacers 84. The second CESL 106 may extend a depth into the openings 109 greater than a thickness of the hard mask 98 such that portions of the second CESL 106 remain after the hard mask 98 is removed by a process such as planarization (as discussed below in reference to FIGS. 19A-19D). Because portions of the openings 109 remain unfilled by the second CESL 106, the gaseous spacers 108 are formed underlying the second CESL 106, between the first gate spacers 80 and the first CESL 94. The gaseous spacers 108 may comprise any gas present in the reaction chamber when the second CESL 106 is deposited. According to an embodiment, the gaseous spacers 108 may comprise air. In some embodiments, the gaseous spacers 108 may comprise nitrogen ($N_2$), argon (Ar), xenon (Xe), ammonia ($NH_3$), chlorine ($Cl_2$), combinations thereof, or the like. In some embodiments, the gaseous spacers 108 may further comprise precursor gases used the form the second CESL 106, including silane ($SiH_4$), dichlorosilane ($SiH_2Cl_2$), silicon tetrachloride ($SiCl_4$), ammonia, combinations thereof, or the like. The gaseous spacers 108 may have a thickness of from about 0.5 nm to about 5 nm or a thickness from about 1 nm to about 10 nm, such as about 5 nm. The gaseous spacers 108 may have a dielectric constant (e.g., a k value) of 1 or close to 1.

The gaseous spacers 108 have a low k-value of 1 or close to 1, which is lower than the k-value of the third gate spacers 84, which may be formed of silicon nitride, and the second gate spacers 82, which may be formed of silicon oxide, as discussed above. Replacing the remaining portions of the third gate spacers 84 and the second gate spacers 82 with the gaseous spacers 108 decreases the overall effective k-value of the spacers (e.g., the combination of the gaseous spacers 108 and the first gate spacers 80) and lowers the parasitic capacitance in devices formed according to the above-described methods. This may increase the circuit speed, reliability, and overall device performance of devices formed according to the above-described methods.

FIG. 18E illustrates a cross-sectional view parallel to a major surface of the substrate 50. As illustrated in FIG. 18E, portions of the gaseous spacers 108 may encircle portions of the first CESL 94 and the first ILD 96. The gaseous spacers 108 may be encircled by the first gate spacers 80. The first CESL 94 and the first ILD 96 may not be present between adjacent epitaxial source/drain regions 92, such as below merged portions of the epitaxial source/drain regions 92.

In FIGS. 19A-19D, the second CESL 106 is planarized and the hard mask 98 is removed. The second CESL 106 may be planarized by a process such as CMP. Portions of the CESL 106 disposed above the first ILD 96, the first CESL 94, and the gate electrode 104 may be removed and, following the planarization, top surfaces of the second CESL 106 and the gate stack may be level with top surfaces of the first ILD 96. The planarization process may further remove the hard mask 98. As discussed previously, the second CESL 106 may be deposited in the openings 109 left by removing the second gate spacers 82 and the third gate spacers 84 to a greater depth than the thickness of the hard mask 98 such that the second CESL 106 remains after the hard mask 98 is removed by the planarization process. Although top surfaces of the second CESL 106 are illustrated as being flat, the top surfaces of the second CESL 106 may be curved after the planarization process. For example, in some embodiments, the top surfaces of the second CESL 106 may be convex or concave.

Figure 19B:
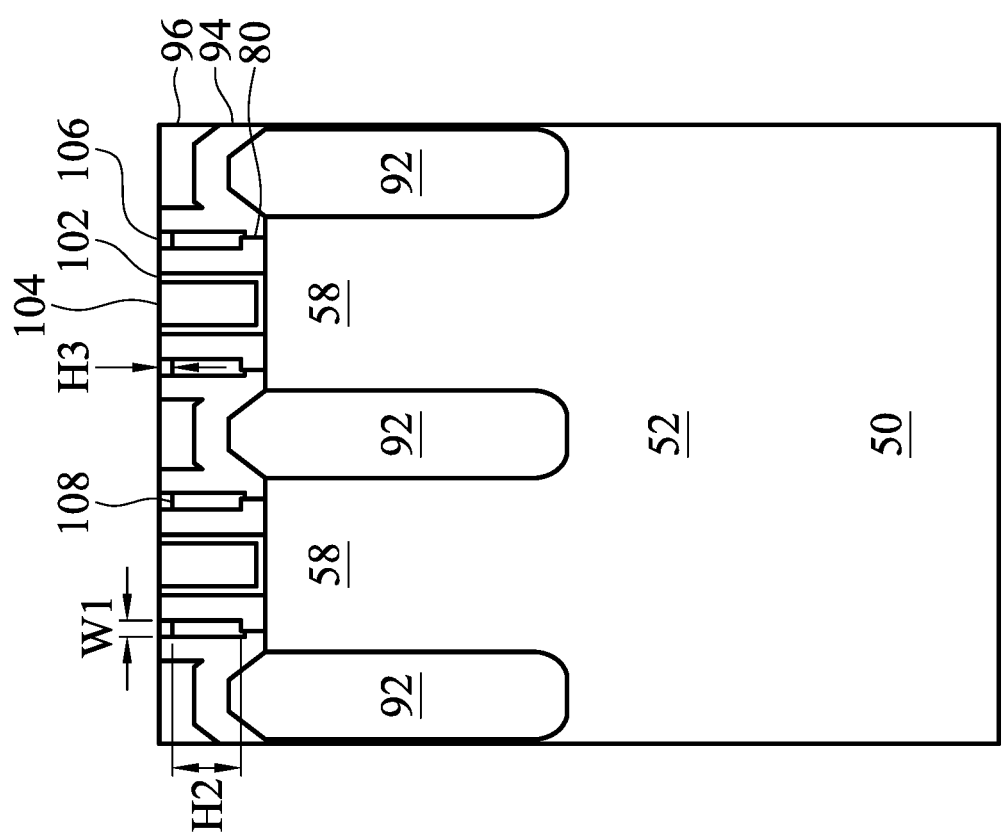
Figure 19A:
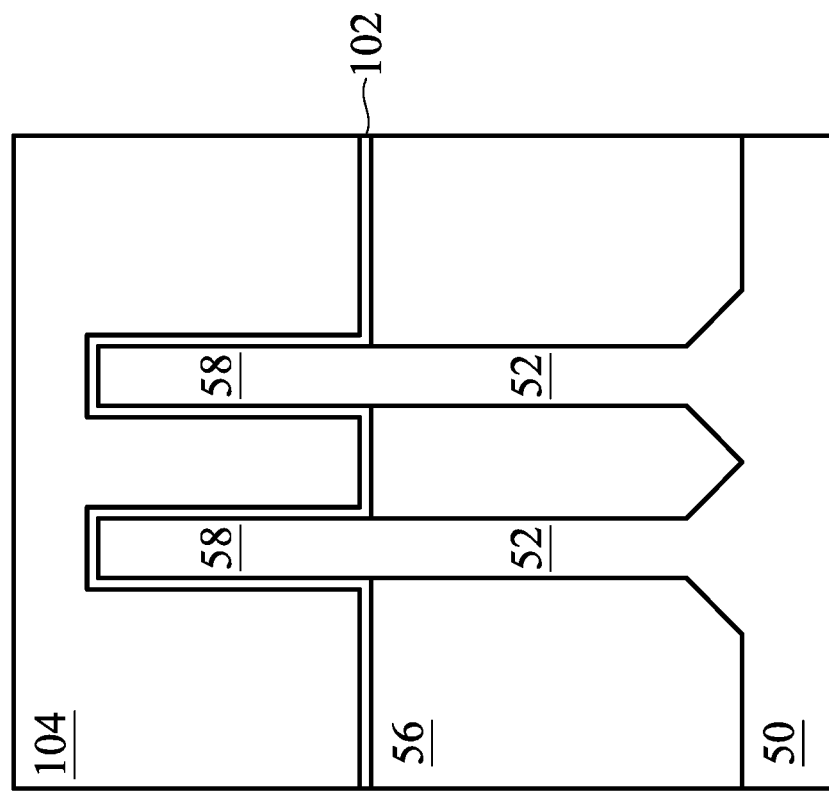
Figure 19D:
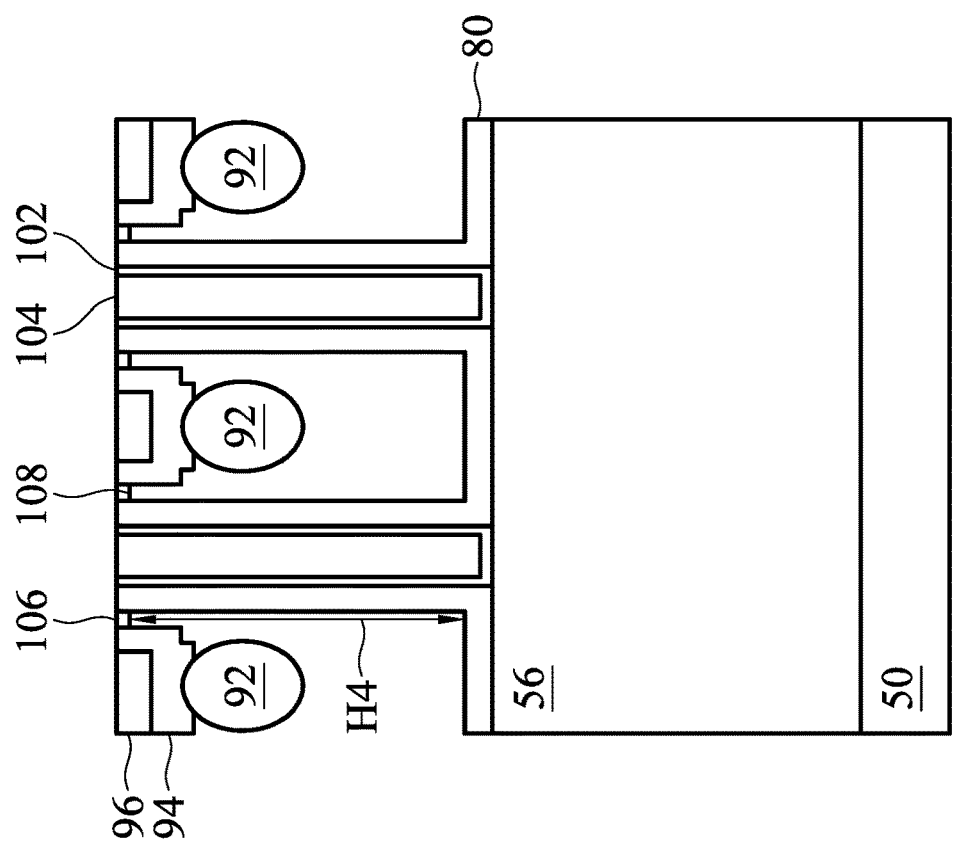
Figure 19C:
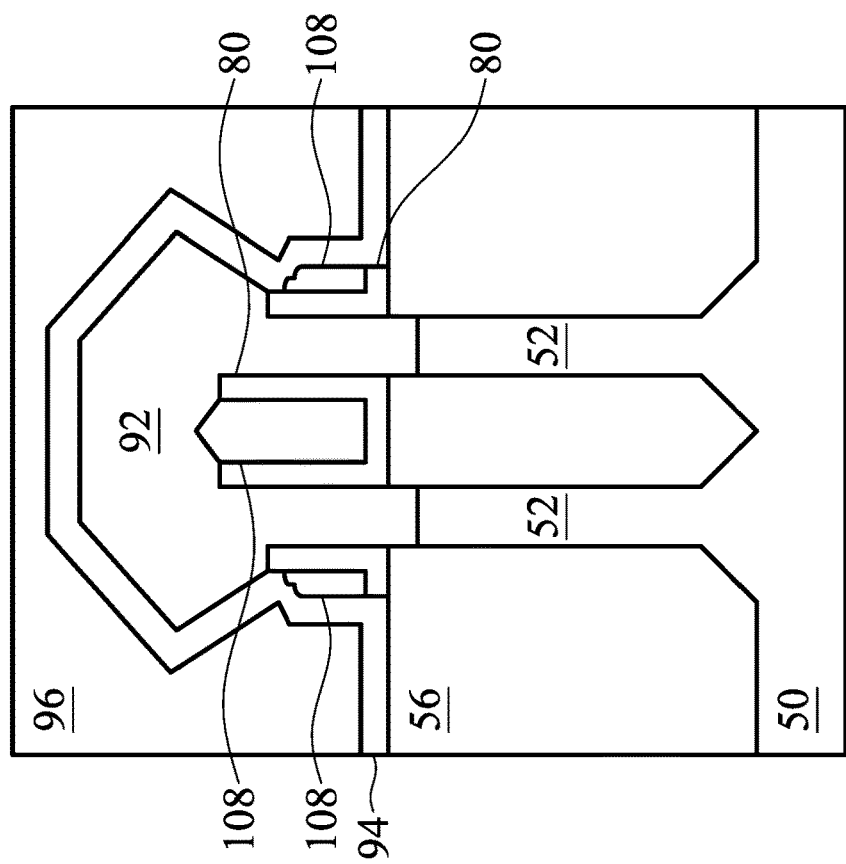

As illustrated in FIG. 19B, a height H2 of the gaseous spacers 108 adjacent the first gate spacers 80 and over the channel regions 58 may be about 8 nm or less. The second CESL 106 and the portion of the gaseous spacer 108 disposed between the first CESL 94 and the first gate spacers 80 may have widths W1 from about 2 nm to about 4 nm. As illustrated in FIG. 19D, a height H4 of the gaseous spacers 108 adjacent the first gate spacers and over the STI regions 56 may be about 62 nm or less. Following the planarization process, the second CESL 106 may have a height H3 of about 6 nm or greater. A ratio of the height H2 to the width W1 may be from about 2 to about 4; a ratio of the height H3 to the width W1 may be from about 1 to about 5; and a ratio of the height H4 to the width W1 may be from about 15 to about 35.

Figure 20B:
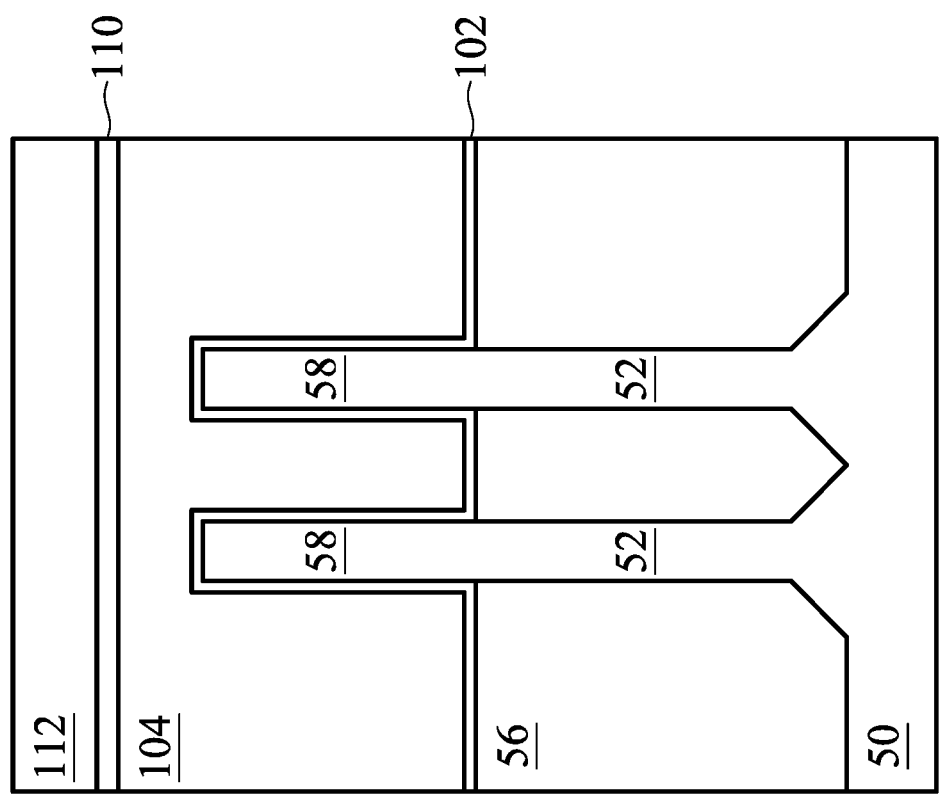
Figure 20A:
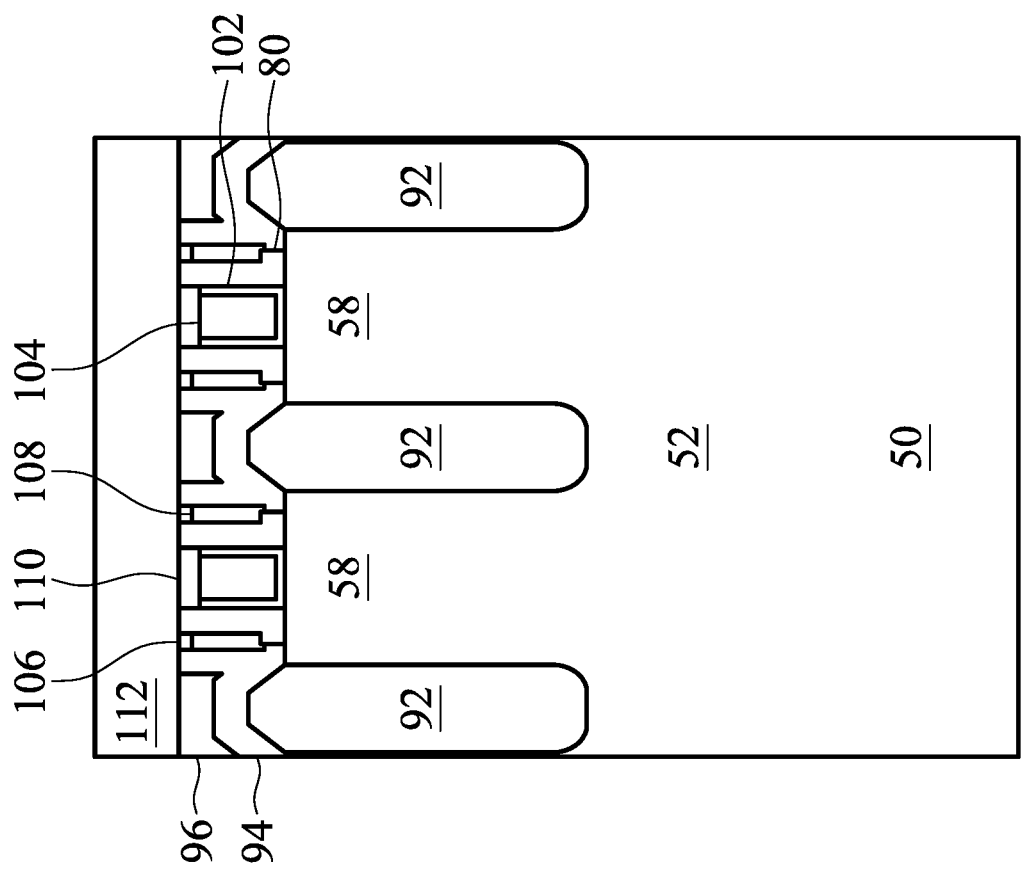
Figure 20D:
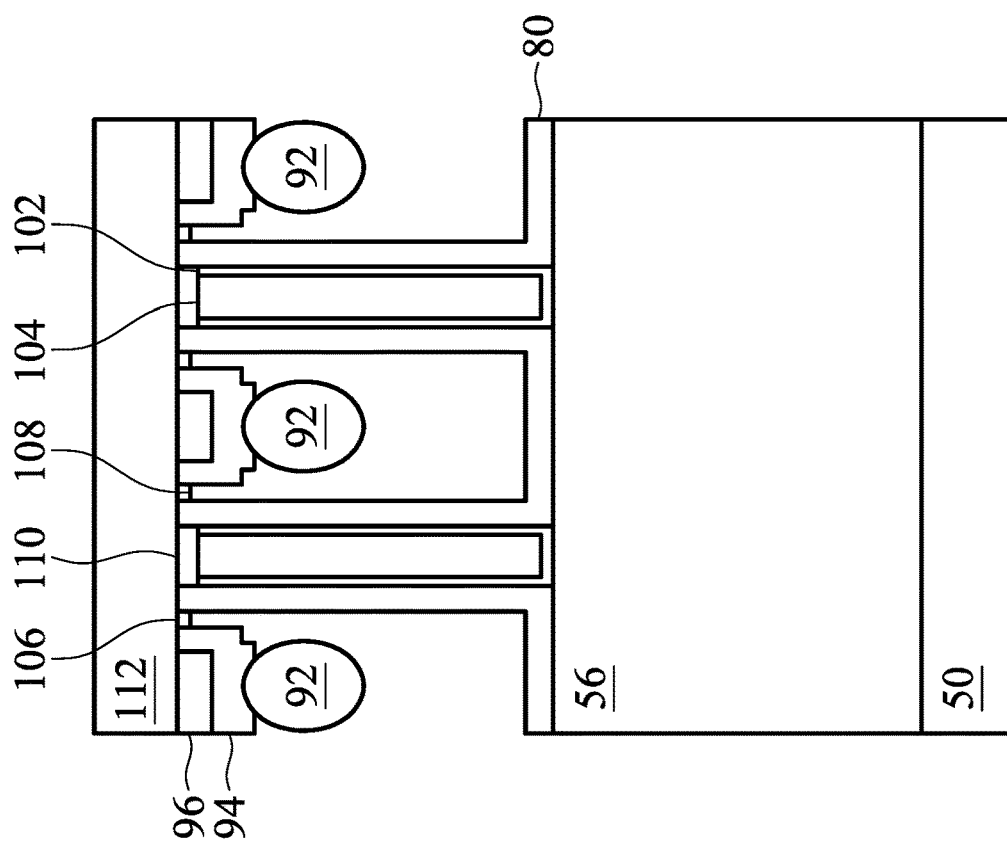
Figure 20C:
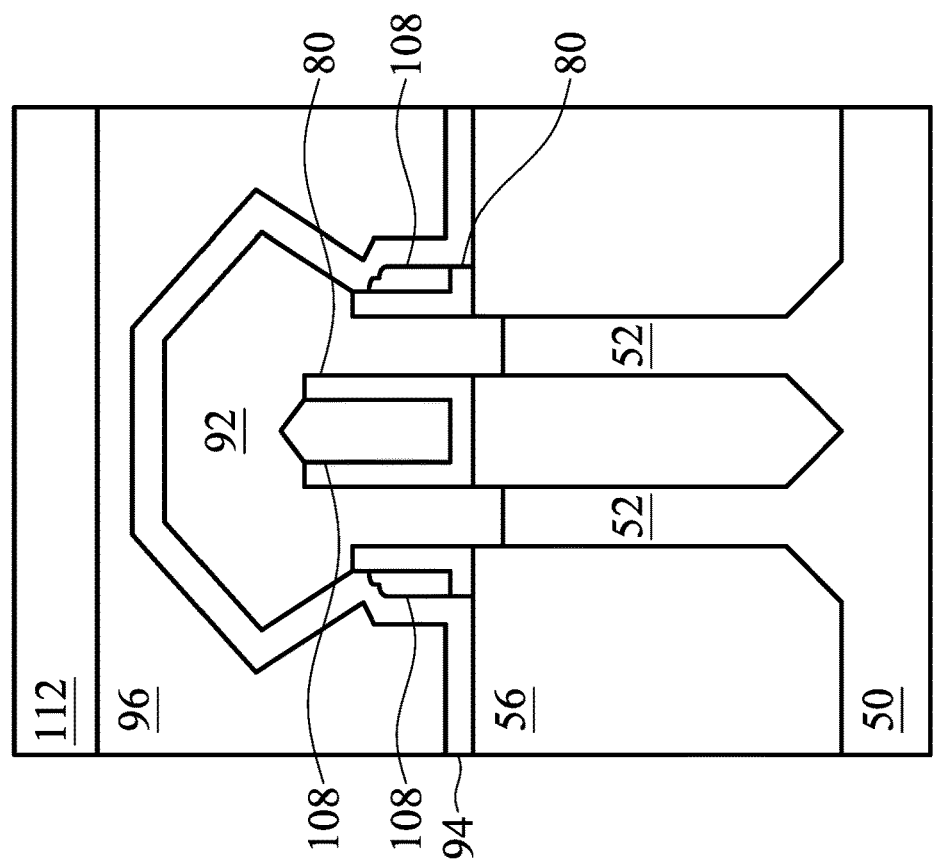
Figure 21D:
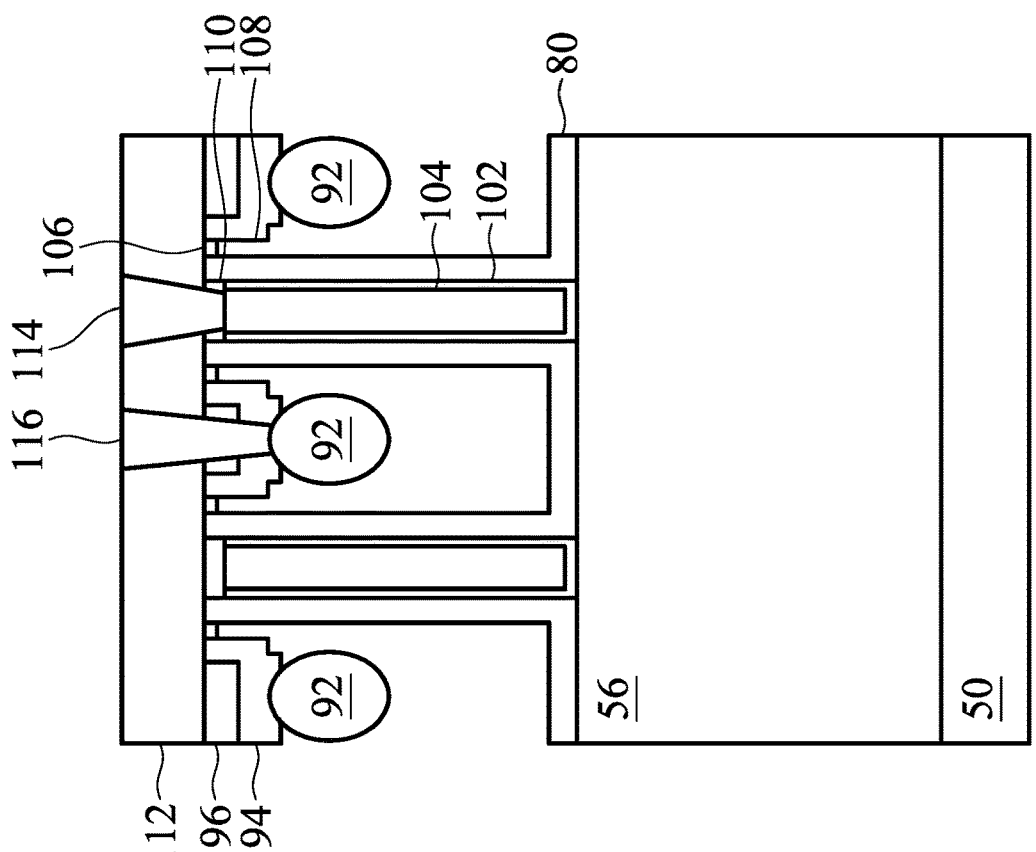
Figure 21C:
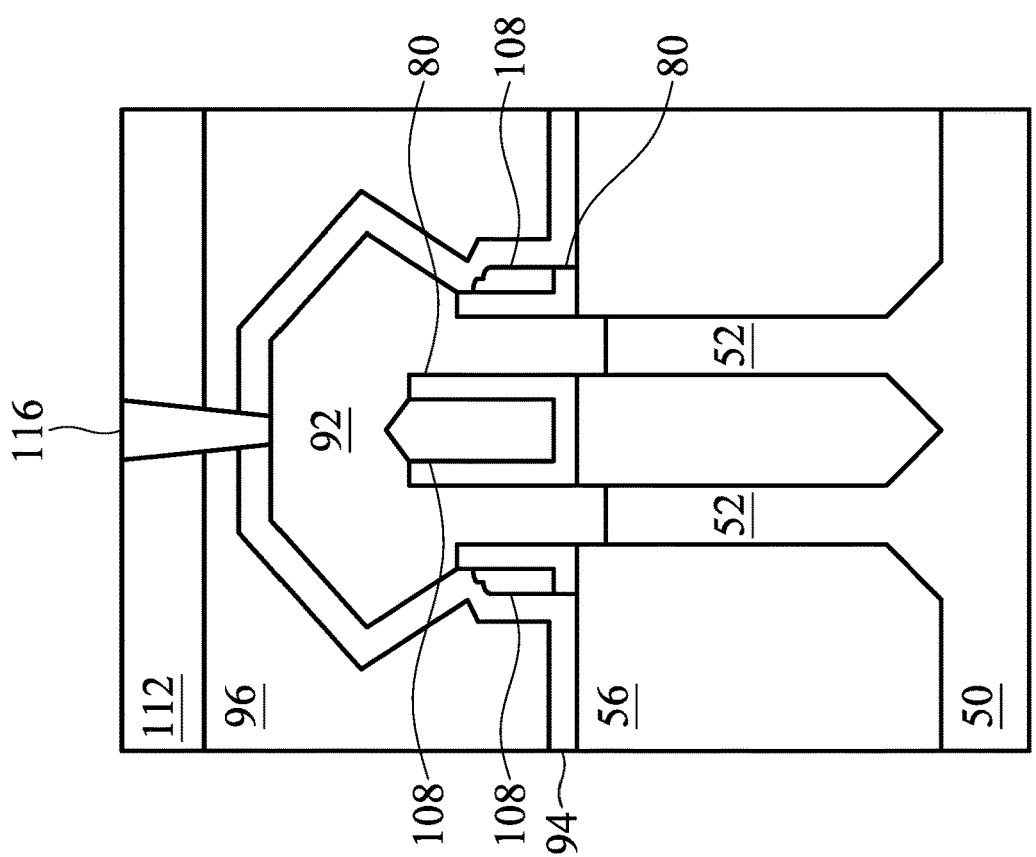

In FIGS. 20A-20D, a second ILD 112 is deposited over the first ILD 96, the gate electrodes 104, the first CESL 94, the second CESL 106, and the first gate spacers 80. In some embodiments, the second ILD 112 is a flowable film formed by a flowable CVD method. The second ILD 112 may be formed of a dielectric material such as PSG, BSG, BPSG, USG, or the like, and may be deposited by any suitable method, such as CVD and PECVD. In accordance with some embodiments, before the formation of the second ILD 112, the gate stack (including the gate dielectric layer 102 and the gate electrodes 104) is recessed, so that a recess is formed directly over the gate stack and between opposing portions of the first gate spacers 80, as illustrated in FIGS. 20A and 20B. A gate mask 110 comprising one or more layers of dielectric material, such as silicon nitride, silicon oxynitride, or the like, is filled in the recess, followed by a planarization process to remove excess portions of the dielectric material extending above the first ILD 96. The subsequently formed gate contacts 114 (FIGS. 21A and 21B) penetrate through the gate mask 110 to contact the top surface of the recessed gate electrode 104.

In FIGS. 21A-21D, gate contacts 114 and source/drain contacts 116 are formed through the second ILD 112 and the first ILD 96 in accordance with some embodiments. Openings for the source/drain contacts 116 are formed through the second ILD 112, the first ILD 96, and the first CESL 94, and openings for the gate contacts 114 are formed through the second ILD 112 and the gate mask 110. The openings may be formed using acceptable photolithography and etching techniques. The openings may be formed in a controlled manner to avoid exposing the gaseous spacers 108. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. The gate contacts and the source/drain contacts may be deposited by a process such as physical vapor deposition (PVD), CVD, or the like. A planarization process, such as a CMP, may be performed to remove excess material from a surface of the second ILD 112. The remaining liner and conductive material form the source/drain contacts 116 and the gate contacts 114 in the openings. An anneal process may be performed to form a silicide at the interface between the epitaxial source/drain regions 92 and the source/drain contacts 116. The source/drain contacts 116 are physically and electrically coupled to the epitaxial source/drain regions 92, and the gate contacts 114 are physically and electrically coupled to the gate electrodes 104. The source/drain contacts 116 and the gate contacts 114 may be formed in different processes, or may be formed in the same process. Although shown as being formed in the same cross-sections, it should be appreciated that each of the source/drain contacts 116 and gate contacts 114 may be formed in different cross-sections, which may avoid shorting of the contacts.

As discussed above, forming the gaseous spacers 108 reduces the effective dielectric constant of the spacers used in the structure of the present application. This reduces parasitic capacitance, which increases circuit speed, reliability, and overall device performance of devices formed according to the above-described methods.

In accordance with an embodiment, a method includes forming a gate stack over a substrate; forming a first gate spacer on sidewalls of the gate stack; forming a second gate spacer over the first gate spacer; removing a portion of the second gate spacer, at least a portion of the second gate spacer remaining; removing the first gate spacer to form a first opening; and after removing the first gate spacer, removing the remaining portion of the second gate spacer through the first opening. In an embodiment, the second gate spacer includes silicon nitride. In an embodiment, the first gate spacer includes silicon oxide. In an embodiment, the first gate spacer and the remaining portion of the second gate spacer are removed by etching using vapor-phase hydrogen fluoride. In an embodiment, the method further includes epitaxially growing source/drain regions on opposite sides of the gate stack, the remaining portion of the second gate spacer being disposed between the source/drain regions and the substrate. In an embodiment, the method further includes epitaxially growing source/drain regions on opposite sides of the gate stack after removing the portion of the second gate spacer, the source/drain regions being epitaxially grown before removing the first gate spacer. In an embodiment, the method further includes replacing the gate stack with a metal gate before removing the first gate spacer. In an embodiment, the first gate spacer and the remaining portion of the second gate spacer are removed by dry etching.

In accordance with another embodiment, a method includes forming a gate stack over a semiconductor substrate; forming a gate spacer on sidewalls of the gate stack; epitaxially growing source/drain regions on opposite sides of the gate stack; removing at least a portion of the gate spacer to form an opening; and depositing a dielectric layer sealing the opening and defining a gaseous spacer on sidewalls of the gate spacer. In an embodiment, a first portion of the gate spacer is removed before epitaxially growing the source/drain regions and a second portion of the gate spacer is removed after epitaxially growing the source/drain regions. In an embodiment, forming the gate spacer includes depositing a first gate spacer layer over the gate stack, depositing a second gate spacer layer over the first gate spacer layer, and depositing a third gate spacer layer over the second gate spacer layer, the first gate spacer layer, the second gate spacer layer, and the third gate spacer layer each including different materials. In an embodiment, the first gate spacer layer includes silicon carbon nitride, the second gate spacer layer includes silicon nitride, and the third gate spacer layer includes silicon oxide. In an embodiment, the first portion includes a portion of the third gate spacer layer. In an embodiment, the second portion includes the second gate spacer layer and a remaining portion of the third gate spacer layer.

In accordance with yet another embodiment, a semiconductor device includes a gate stack over a semiconductor substrate; a first gate spacer disposed on sidewalls of the gate stack; a contact etch stop layer adjacent the first gate spacer; a gaseous spacer disposed between the gate stack and the contact etch stop layer; and an epitaxial source/drain region in the semiconductor substrate, at least a portion of the gaseous spacer extending between the epitaxial source/drain region and the semiconductor substrate. In an embodiment, the gaseous spacer includes ammonia ($NH_3$) and at least one of silane ($SiH_4$), dichlorosilane ($SiH_2Cl_2$), or silicon tetrachloride ($SiCl_4$). In an embodiment, the semiconductor device further includes a first dielectric layer over the epitaxial source/drain region, at least a portion of a boundary of the gaseous spacer being defined by the first dielectric layer. In an embodiment, the gaseous spacer is disposed vertically between the first dielectric layer and the first gate spacer, and the gaseous spacer is disposed horizontally between the contact etch stop layer and the first gate spacer. In an embodiment, the first dielectric layer and the contact etch stop layer include silicon carbon nitride, and the first gate spacer includes silicon carbon nitride. In an embodiment, the gaseous spacer has a thickness of from 1 nm to 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first fin and a second fin extending from a semiconductor substrate;
    a gate stack over the first fin and the second fin;
    a first gate spacer disposed on sidewalls of the gate stack;
    an epitaxial source/drain region in the first fin and the second fin;
    a gaseous spacer disposed between the epitaxial source/drain region and the semiconductor substrate and between the first fin and the second fin; and
    a first contact etch stop layer (CESL) over the epitaxial source/drain region adjacent the first gate spacer and a first interlayer dielectric (ILD) over the first CESL, wherein a first portion of a boundary of the gaseous spacer is defined by the first CESL.

2. The semiconductor device of claim 1, wherein a second portion of the boundary of the gaseous spacer is defined by the epitaxial source/drain region.

3. The semiconductor device of claim 2, wherein a third portion of the boundary of the gaseous spacer is defined by the first gate spacer.

4. The semiconductor device of claim 1, further comprising a second CESL extending from the first CESL to the first gate spacer, wherein a second portion of the boundary of the gaseous spacer is defined by the second CESL.

5. The semiconductor device of claim 4, wherein the second CESL comprises silicon nitride.

6. The semiconductor device of claim 5, wherein the gaseous spacer comprises silane.

7. A semiconductor device comprising:
a fin extending from a substrate;
a gate stack over the fin;
a first gate spacer adjacent the gate stack;
a first source/drain region in the fin adjacent the first gate spacer;
a first contact etch stop layer (CESL) over the first source/drain region;
a first dielectric layer extending from the first gate spacer to the first CESL; and
a gaseous spacer vertically between the first gate spacer and the first dielectric layer.

8. The semiconductor device of claim 7, wherein the first dielectric layer comprises silicon nitride.

9. The semiconductor device of claim 8, wherein the gaseous spacer comprises ammonia and silane.

10. The semiconductor device of claim 7, wherein the gaseous spacer is horizontally between the first gate spacer and the first CESL.

11. The semiconductor device of claim 7, wherein the gaseous spacer is horizontally between the first gate spacer and the first source/drain region.

12. The semiconductor device of claim 7, wherein the gaseous spacer contacts opposite side surfaces of the source/drain region.

13. The semiconductor device of claim 7, wherein the first dielectric layer has a width from 1 nm to 10 nm.

14. A method comprising:
forming a gate stack over a semiconductor substrate;
depositing a first gate spacer layer over the gate stack;
depositing a second gate spacer layer over the first gate spacer layer;
depositing a third gate spacer layer over the second gate spacer layer;
patterning the first gate spacer layer, the second gate spacer layer, and the third gate spacer layer;
epitaxially growing source/drain regions on opposite sides of the gate stack;
removing the second gate spacer layer and the third gate spacer layer to form an opening; and
depositing a dielectric layer sealing the opening and defining a gaseous spacer on sidewalls of the first gate spacer layer.

15. The method of claim 14, wherein patterning the first gate spacer layer, the second gate spacer layer, and the third gate spacer layer comprises anisotropically etching the first gate spacer layer, the second gate spacer layer, and the third gate spacer layer.

16. The method of claim 14, further comprising:
depositing a contact etch stop layer (CESL) over the source/drain regions;
depositing an interlayer dielectric layer (ILD) over the CESL; and
planarizing the CESL, the ILD, the gate stack, the first gate spacer layer, and the second gate spacer layer.

17. The method of claim 16, wherein removing the second gate spacer layer and the third gate spacer layer comprises etching the second gate spacer layer to expose the third gate spacer layer, then etching the third gate spacer layer.

18. The method of claim 14, wherein the first gate spacer layer comprises silicon carbon nitride, the second gate spacer layer comprises silicon nitride, and the third gate spacer layer comprises silicon oxide.

19. The method of claim 14, further comprising planarizing the dielectric layer, the gate stack, and the first gate spacer layer.

20. The semiconductor device of claim 4, wherein a third portion of the boundary of the gaseous spacer is defined by the epitaxial source/drain region, and wherein a fourth portion of the boundary of the gaseous spacer is defined by the first gate spacer.

* * * * *